(12) United States Patent
Maruyama

(10) Patent No.: US 6,424,592 B1
(45) Date of Patent: Jul. 23, 2002

(54) SEMICONDUCTOR INTEGRATED CIRCUIT HAVING CIRCUIT FOR CORRECTING DATA OUTPUT TIMING

(75) Inventor: Yukiko Maruyama, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 116 days.

(21) Appl. No.: 09/725,855

(22) Filed: Nov. 30, 2000

(51) Int. Cl.[7] .................................................. G11C 8/00
(52) U.S. Cl. .................... 365/233; 365/194; 365/189.05
(58) Field of Search ................................ 365/233, 194, 365/189.05, 233.5

(56) References Cited

U.S. PATENT DOCUMENTS

| | | | | |
|---|---|---|---|---|
| 4,272,390 A | * | 6/1981 | Watson, Jr. et al. | 307/369 |
| 5,815,016 A | * | 9/1998 | Erickson | 327/158 |
| 5,923,613 A | * | 7/1999 | Tien et al. | 365/233 |
| 5,969,551 A | * | 10/1999 | Fujioka | 327/149 |
| 6,121,815 A | * | 9/2000 | Terada et al. | 327/292 |
| 6,166,990 A | * | 12/2000 | Ooishi et al. | 365/233 |

FOREIGN PATENT DOCUMENTS

| | | |
|---|---|---|
| JP | 10-301663 | 11/1998 |
| JP | 11-66852 | 3/1999 |
| JP | 11-143575 | 5/1999 |

\* cited by examiner

Primary Examiner—Richard Elms
Assistant Examiner—Tuan T. Nguyen
(74) Attorney, Agent, or Firm—McDermott, Will & Emery

(57) ABSTRACT

A semiconductor integrated circuit includes a DLL circuit generating an internal clock signal, a plurality of clock generators generating respective output clock signals based on the internal clock signal, a plurality of output buffers outputting to a plurality of data input/output pins data according to corresponding output clock signals respectively, and a selection circuit. The selection circuit outputs a code signal for allowing the timing of the earliest output clock signal to conform to the timing of the latest output clock signal. A predetermined clock generator adjusts the timing of the output clock signal according to the code signal.

16 Claims, 28 Drawing Sheets

FIG. 14

| case | 1 | 2 | 3 | 4 |
|---|---|---|---|---|
| CA,CB,CC | H,H,H | L,H,H | L,L,H | L,L,L |
| H | C0 | C1 | C2 | C3 |
| P2-size | A | B | C | C |
| P1-size | A | A | B | B |

FIG. 22

| case | 4 | 3 | 2 | 1 |
|---|---|---|---|---|
| CA,CB,CC | H,H,H | L,H,H | L,L,H | L,L,L |
| H | C0 | C1 | C2 | C3 |
| P4-size | A | D | E | E |
| P3-size | A | A | D | D |

SEMICONDUCTOR INTEGRATED CIRCUIT HAVING CIRCUIT FOR CORRECTING DATA OUTPUT TIMING

BACKGROUND OF THE INVENTION

1. Field of the Invention

The present invention relates to semiconductor integrated circuits and particularly to a semiconductor integrated circuit having a circuit for correcting data output timing.

2. Description of the Background Art

Dynamic random access memory DRAM has been known as the one achieving a high-speed operation. Such a DRAM (hereinafter referred to as semiconductor integrated circuit) is structured to include a DLL (delayed locked loop) circuit for outputting a multiple number of data at the same timing based on an internal clock signal supplied from the DLL circuit.

One example of such a conventional semiconductor integrated circuit is described in conjunction with FIG. 28. The conventional semiconductor integrated circuit 5000 includes a DLL circuit 501 generating internal clock signal DLLCLK for determining the timing of an internal operation, clock generators PX0–PX7, and output buffers 502#0–502#7.

Output buffer 502#i receives read data RDi and ZRDi from a data input/output line L to output corresponding data to a data input/output pin DQ (i) (i=0–7). In FIG. 28, RD (0:7) represents RD0, ..., RD7 and ZRD (0:7) represents ZRD0, ..., ZRD7.

Clock generators PX0–PX7 have the same structures respectively. The clock generators respectively generate output clock signals CLKQ (0)–CLKQ (7) based on internal clock signal DLLCLK received via a line 101. Output clock signals CLKQ (0)–CLKQ (7) determine timing of outputting data from respective output buffers 502#–502#7.

This structure allows 8-bit output data DQ (0)–DQ (7) to be supplied to any external unit at a time.

In such a semiconductor integrated circuit, any load of line 101 causes difference in arrival time of internal clock signal DLLCLK at respective clock generators PX0–PX7.

Specifically, clock generator PX3 located closest to DLL circuit 501 and clock generator PX0 remotest from DLL circuit 501 are different in the length of line for receiving internal dock signal DLLCLK. Therefore, clock generators PX3 and PX0 receive internal clock signal DLLCLK at different times respectively and consequently there is generated a certain difference between respective output clock signals. As a result, data are output from respective data input/output pins DQ (0) and DQ (3) at different times.

For the DRAM operating at high speed, data output timing (time tAC) is severely defined. Therefore, for the structure of the conventional semiconductor integrated circuit, a skew between DQs is likely to be out of the range of specification.

Since this skew depends on noise and process of peripheral circuitry, the output timing has been adjusted by revise of a mask and the like. Nevertheless, this measure cannot overcome the skew occurring in the actual environment.

SUMMARY OF THE INVENTION

The present invention accordingly provides a semiconductor integrated circuit having a function of correcting data output timing.

According to one aspect of the invention, a semiconductor integrated circuit includes a memory cell array having a plurality of memory cells, a plurality of data output pins, a plurality of output buffers provided correspondingly to respective data output pins to output data read from the memory cell array to corresponding data output pins respectively, an internal clock generator generating an internal clock signal, a plurality of clock generators provided correspondingly to respective output buffers to generate an output clock signal determining output timing of a corresponding output buffer based on the internal clock signal, and a correction circuit correcting a skew in data output timing between the data output pins.

Preferably, the correction circuit includes a detection circuit detecting the skew in data output timing between the data output pins and the clock generators include a variable clock generator generating the output clock signal having its phase varied according to an output of the detection circuit.

In particular, the detection circuit detects difference in phase between an output dock signal supplied from a clock generator where the internal clock signal arrives latest and an output clock signal supplied from a clock generator where the internal clock signal arrives earliest.

In particular, the variable clock generator includes a plurality of generators generating based on the internal dock signal respective output dock signals having respective phases different from each other, and one of the generators is selectively operated according to the output of the detection circuit.

Preferably, the clock generators include a variable clock generator having a plurality of generators generating based on the internal clock signal respective output clock signals with respective phases different from each other, and the correction circuit selectively operates one of the generators to allow output timing of the clock generators to conform to output timing of a clock generator where the internal clock signal arrives latest.

Preferably, the clock generators include a variable clock generator having a plurality of generators generating based on the internal clock signal respective output clock signals with respective phases different from each other, and the correction circuit selectively operates one of the generators to allow output timing of the clock generators to conform to output timing of a clock generator where the internal clock signal arrives earliest.

In particular, the clock generators include a clock generator where the internal clock signal arrives latest and a variable clock generator having a plurality of generators generating based on the internal clock signal respective output clock signals with respective phases different from each other. The detection circuit includes a first circuit imitating an output of the clock generator where the internal clock signal arrives latest, a second circuit imitating respective outputs of the generators, a phase comparator comparing phase of an output of the first circuit with phase of an output of the second circuit, and a circuit for selecting any of respective outputs of the generators that is closest to the output of the clock generator where the internal clock signal arrives latest according to result of the phase comparison. Alternatively, the clock generators include a clock generator where the internal clock signal arrives earliest and a variable clock generator having a plurality of generators generating based on the internal clock signal respective output clock signals with respective phases different from each other. The detection circuit includes a first circuit imitating an output of the clock generator where the internal clock signal arrives earliest, a second circuit imitating respective outputs of the generators, a phase comparator comparing phase of an output of the first circuit with phase of an output of the second circuit, and a circuit for selecting any of respective outputs of the generators that is closest to the output of the clock generator where the internal clock signal arrives earliest according to result of the phase comparison.

Preferably, the internal clock generator includes a delay circuit delaying an external clock signal to output the internal clock signal, an output circuit receiving and outputting the internal clock signal, and a circuit controlling delay time of the delay circuit according to a phase difference between an output of the output circuit and the internal clock signal. The correction circuit includes a detection circuit detecting a skew in data output timing between the data output pins, and an adjustment circuit adjusting phase of the output of the output circuit according to an output of the detection circuit.

According to another aspect of the invention, a semiconductor integrated circuit includes a memory cell array having a plurality of memory cells, a plurality of data output pins, a plurality of output buffers provided correspondingly to respective data output pins to output data read from the memory cell array to corresponding data output pins respectively, an internal clock generator generating an internal clock signal, a plurality of clock generators provided correspondingly to respective output buffers to generate an output clock signal determining output timing of a corresponding output buffer based on the internal clock signal, and a correction circuit correcting data output timing of the data output pins. The internal clock generator includes a delay circuit delaying an external clock signal to output the internal clock signal, an output circuit receiving and outputting the internal clock signal, and a circuit controlling delay time of the delay circuit according to a phase difference between an output of the output circuit and the internal clock signal. The correction circuit includes a detection circuit detecting a skew in data output timing between the data output pins, and an adjustment circuit adjusting phase of the output of the output circuit according to an output of the detection circuit.

Preferably, the detection circuit detects a difference in phase between an output clock signal supplied from a clock generator where the internal clock signal arrives latest and an output clock signal supplied from a clock generator where the internal clock signal arrives earliest.

In this way, according to the semiconductor integrated circuit discussed above, the clock generators are adjusted in size to enable data output times to conform to each other. Skew in data output timing between the data output pins can thus be corrected Margin of data output timing can accordingly be improved.

The semiconductor integrated circuit as described above can avoid nonuniform data output timing, by adjusting the phase of the internal clock signal of the internal clock generator. Margin of data output timing can thus be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 illustrates selection of circuit size according to the first embodiment.

FIG. 22 illustrates selection of circuit size according to the second embodiment.

DESCRIPTION OF THE PREFERRED EMBODIMENTS

Figure 1:
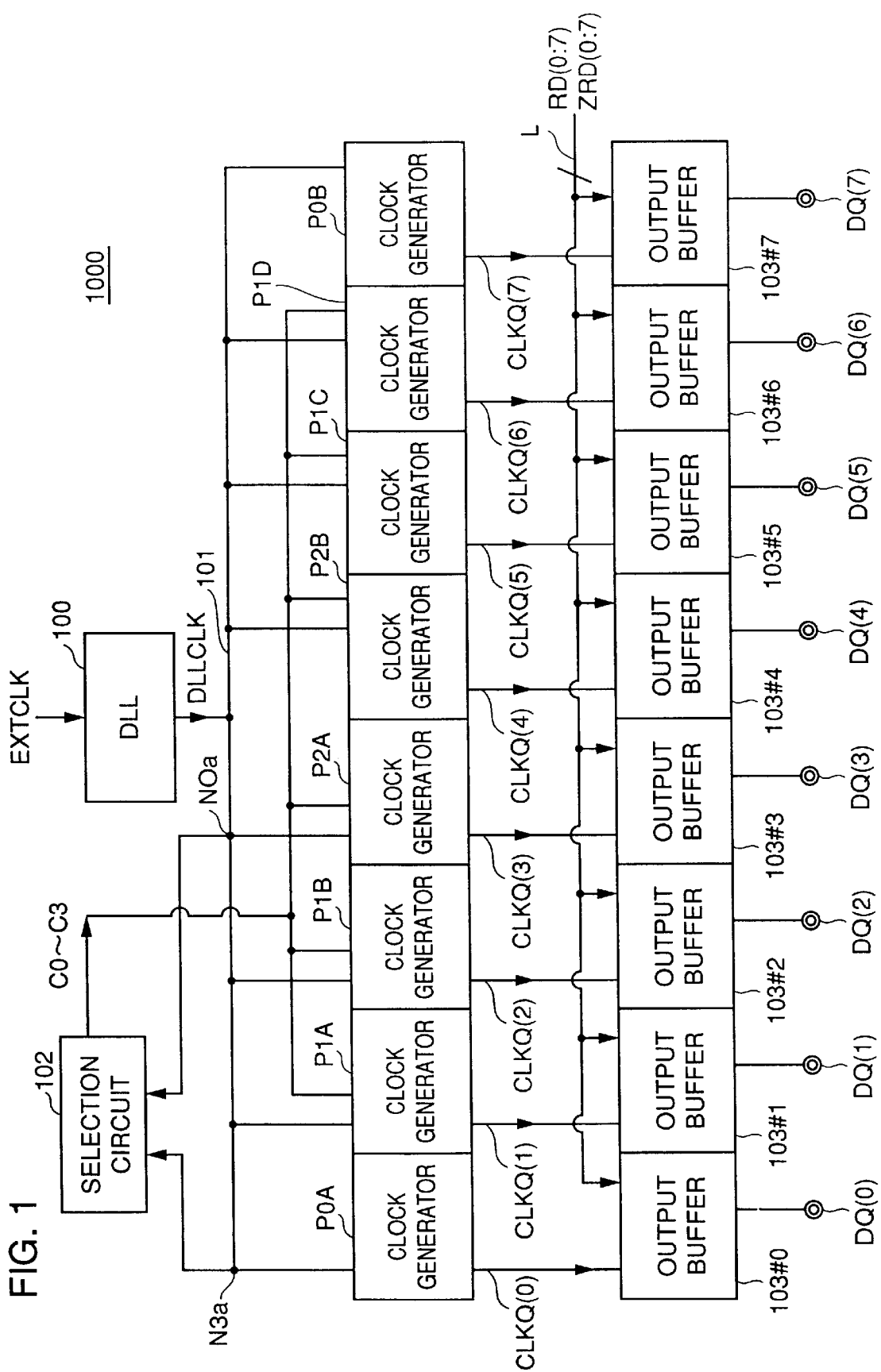
FIG. 1 is a block diagram generally showing a structure of a major part of a semiconductor integrated circuit 1000 according to a first embodiment.

According to embodiments of the present invention, a semiconductor integrated circuit is now described in conjunction with drawings in which like or corresponding components are denoted by the same reference characters and description thereof is not repeated here.

First Embodiment

A semiconductor integrated circuit 1000 according to the first embodiment is described. As shown FIG. 1 semiconductor integrated circuit 1000 includes a DLL circuit 100, a selection circuit 102, clock generators P0A, P0B, P1A–P1D, P2A and P2B, and output buffers 103#0–103#7.

DLL circuit 100 outputs internal clock signal DLLCLK synchronized with external clock signal EXTCLK. The clock generators generate output clock signals respectively determining data output timing based on internal clock signal DLLCLK supplied via a line 101.

Clock generators P2A and P2B are located closest to an output node of DLL circuit 100. Clock generators P1A and P1B and clock generators P1C and P1D are arranged with clock generators P2A and P2B interposed therebetween. Clock generators P0A and P0B are further arranged with clock generators P1A–P1D interposed therebetween.

Respective output clock signals from clock generators P0A, P1A, P1B and P2A are represented by CLKQ (0), CLKQ (1), CLKQ (2) and CLKQ (3) respectively. Respective output clock signals from clock generators P2B, P1C, P1D and P0B are represented by CLKQ (4), CLKQ (5), CLKQ (6) and CLKQ (7) respectively.

Clock generators P0A and P0B have the same structures respectively, clock generators P1A–P1D have the same structures respectively, and clock generators P2A and P2B have the same structures respectively.

According to the first embodiment, circuit size (operation speed) of clock generators P1A–P1D, P2A and P2B is adjusted to allow respective output times of data input/output pins to conform to each other.

Figure 2:
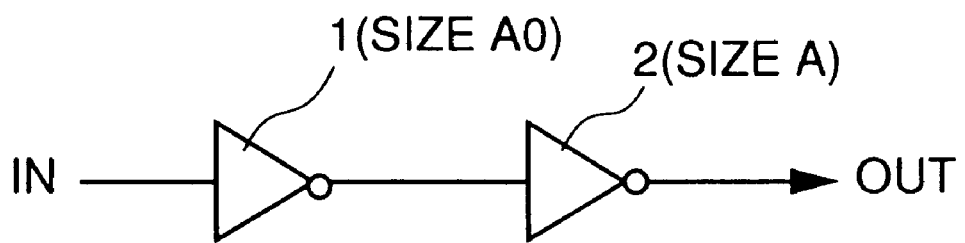
FIG. 2 is a circuit diagram showing a structure of a clock generator P0.

Referring to FIG. 2, a structure of clock generator P0 (corresponding to P0A and P0B each) is described. Clock generator P0 includes inverters 1 and 2. Inverter 1 has a circuit size of "A0" and inverter 2 has a circuit size of "A." Inverter 1 inverts a signal on an input node IN and inverter 2 inverts an output of inverter 1 to output the inverted signal to a node OUT.

Figure 3:
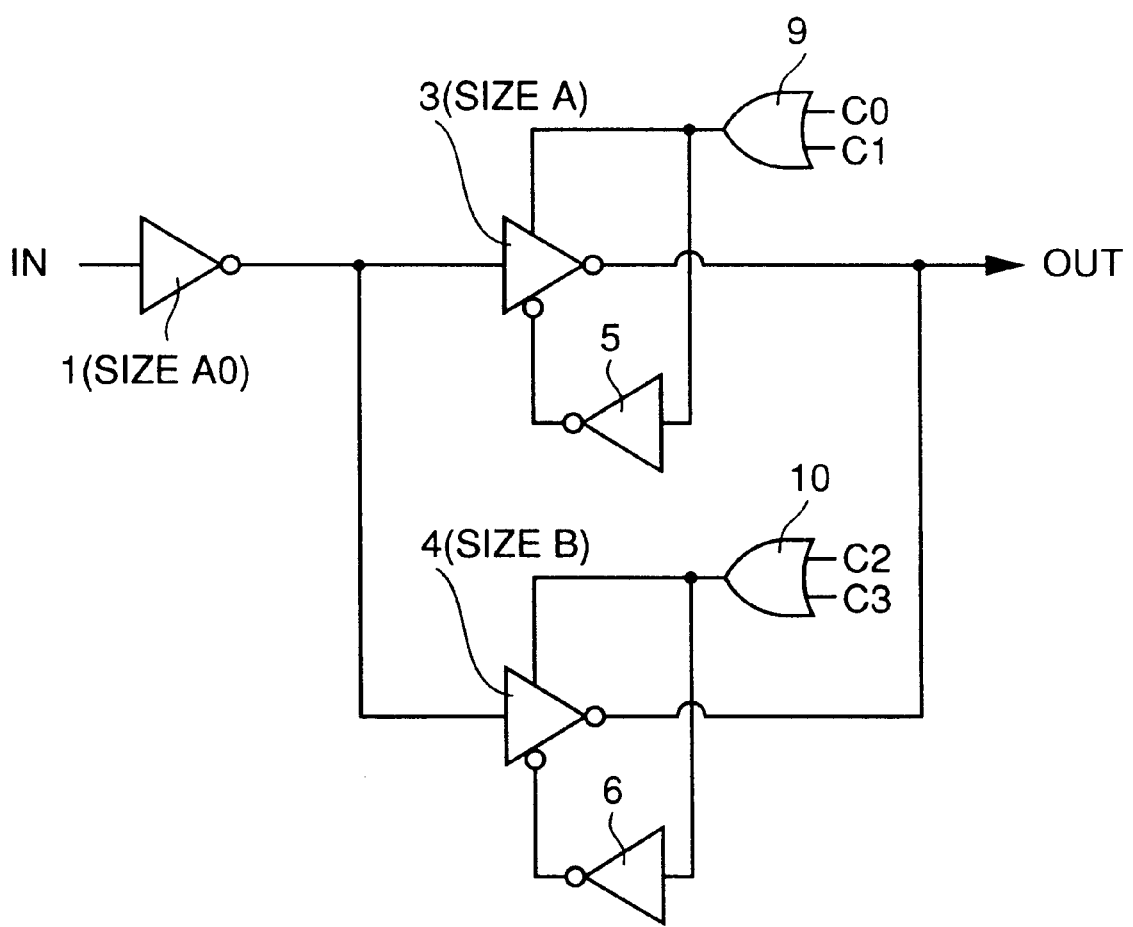
FIG. 3 is a circuit diagram showing a structure of a clock generator P1.

Referring to FIG. 3, a structure of dock generator P1 (corresponding to P1A–P1D each) is described. Clock generator P1 includes inverters 1, 3–6 and OR circuits 9 and 10. Inverter 1 has a circuit size of "A0," inverter 3 has a circuit size of "A" and inverter 4 has a circuit size of "B" (A>B). Inverter 1 inverts a signal on input node IN and inverters 3 and 4 each invert an output of inverter 1 to output the inverted signal to node OUT.

OR circuit 9 receives code signals C0 and C1 from selection circuit 102 and OR circuit 10 receives code signals C2 and C3 from selection circuit 102. Inverters 5 and 6 invert respective outputs of OR circuits 9 and 10 respectively. Inverter 3 outputs a signal according to respective outputs of OR circuit 9 and inverter 5, and inverter 4 outputs a signal according to respective outputs of OR circuit 10 and inverter 6.

Figure 4:
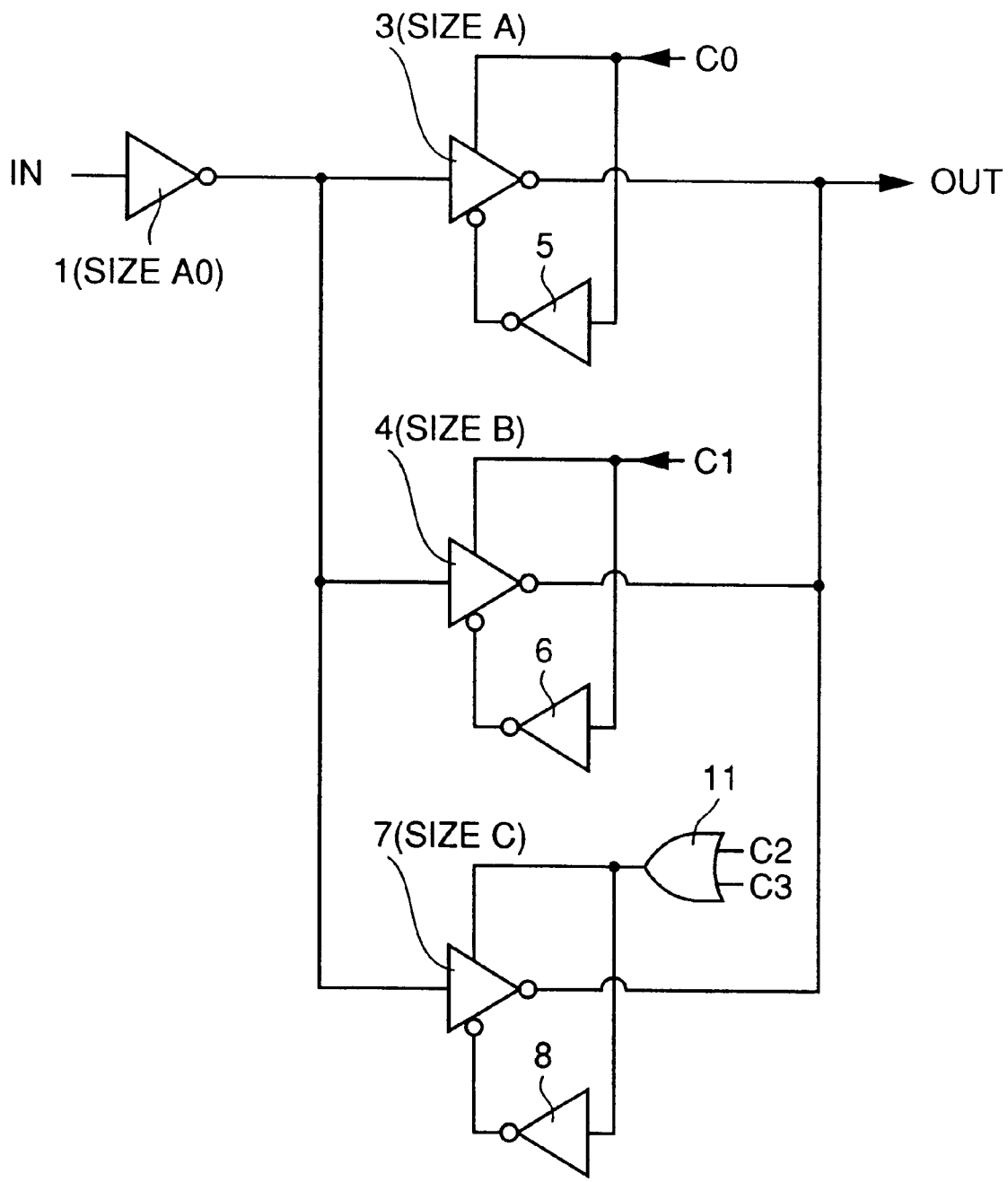
FIG. 4 is a circuit diagram showing a structure of a clock generator P2.

Referring to FIG. 4, a structure of clock generator P2 (corresponding to P2A and P2B each) is described. Clock generator P2 includes inverters 1, 3–8 and an OR circuit 11. Inverter 1 has a circuit size of "A0," inverter 3 has a circuit size of "A," inverter 4 has a circuit size of "B" and inverter 7 has a circuit size of "C" (A>B>C). Inverter 1 inverts a signal on input node IN and inverters 3, 4 and 7 each invert an output of inverter 1 and output the inverted signal to node OUT On circuit 11 receives code signals C2 and C3 from selection circuit 102. Inverters 5, 6 and 8 invert code signal C0, code signal C1 and an output of OR circuit 11 respectively. Inverter 3 outputs a signal according to code signal C0 and an output of inverter 5, inverter 4 outputs a signal according to code signal C1 and an output of inverter 6, and inverter 7 outputs a signal according to respective outputs of OR circuit 11 and inverter 8.

It is noted that the size A0, A, B and C is determined by the gate width W and the gate length L of a transistor and operation speeds are different depending on the size.

In clock generator P1, inverter 3 or 4 is selected according to code signals C0–C3. In dock generator P2, inverter 3, 4 or 7 is selected according to code signals C0–C3. Respective operation speeds of dock generators P1 and P2 are thus changed according to code signals C0–C3.

Selection circuit 102 shown in FIG. 1 is described. Selection circuit 102 has a first input node connected to a node N0a where clock generator P2A receives internal dock signal DLLCLK and a second input node connected to a node N3a where clock generator P0A receives internal clock signal DLLCLK.

Figure 5:
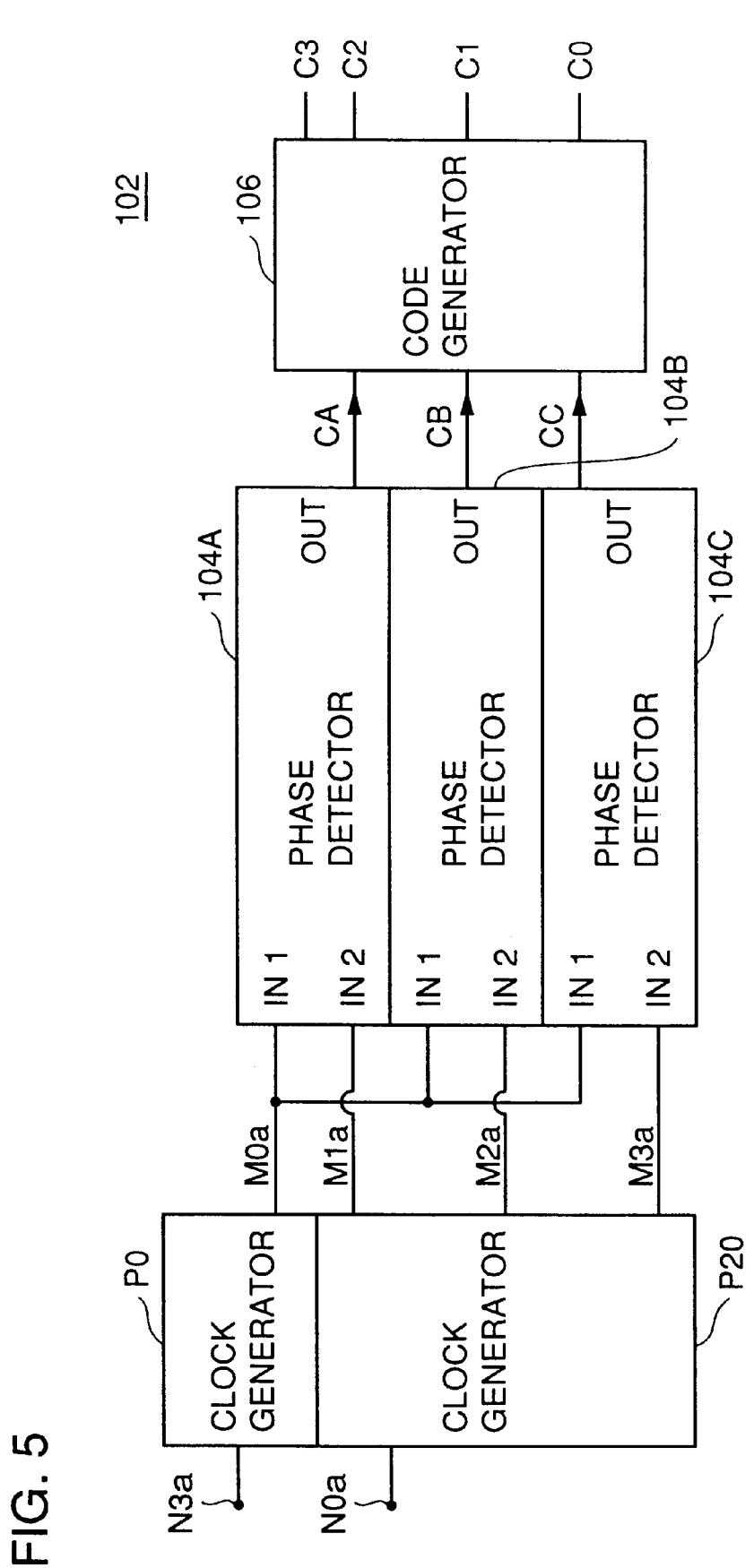
FIG. 5 is a block diagram showing a structure of a selection circuit 102.

Referring to FIG. 5, selection circuit 102 includes clock generators P0 and P20, phase detectors 104A, 104B and 104C and a code generator 106. Clock generator P0 has the same structure as that of dock generators P0A and P0B. Clock generator P0 receives a signal on node N3a and outputs signal M0a.

Figure 6:
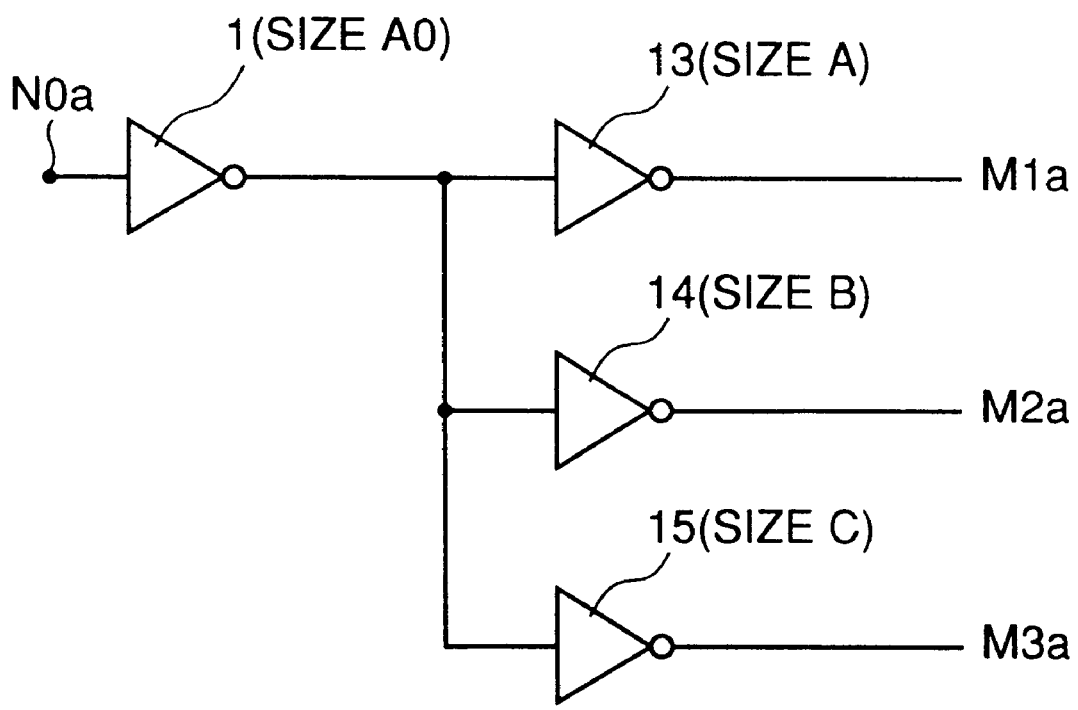
FIG. 6 is a circuit diagram showing a structure of a clock generator P20.

Clock generator P20 receives a signal on node N0a and outputs signals M1a, M2a and M3a. The circuit structure of clock generator P20 is a combination of inverters that are the same in inverter size as those of clock generator P2. As shown in FIG. 6, clock generator P20 includes an inverter 1 inverting a signal on node N0a and inverters 13–15 inverting an output of inverter 1. Inverters 13, 14 and 15 respectively output signals M1a, M2a and M3a.

Inverter 13 has a circuit size of "A" (equal to the size of inverters 2 and 3), inverter 14 has a circuit size of "B" (equal to the size of inverter 4) and inverter 15 has a circuit size of "C" (equal to the size of inverter 7).

Signal M0a has the same timing as that of output clock signal CLKQ (0) and signal M1a, M2a, or M3a has the same timing as that of output clock signal CLKQ (3).

Figure 7:
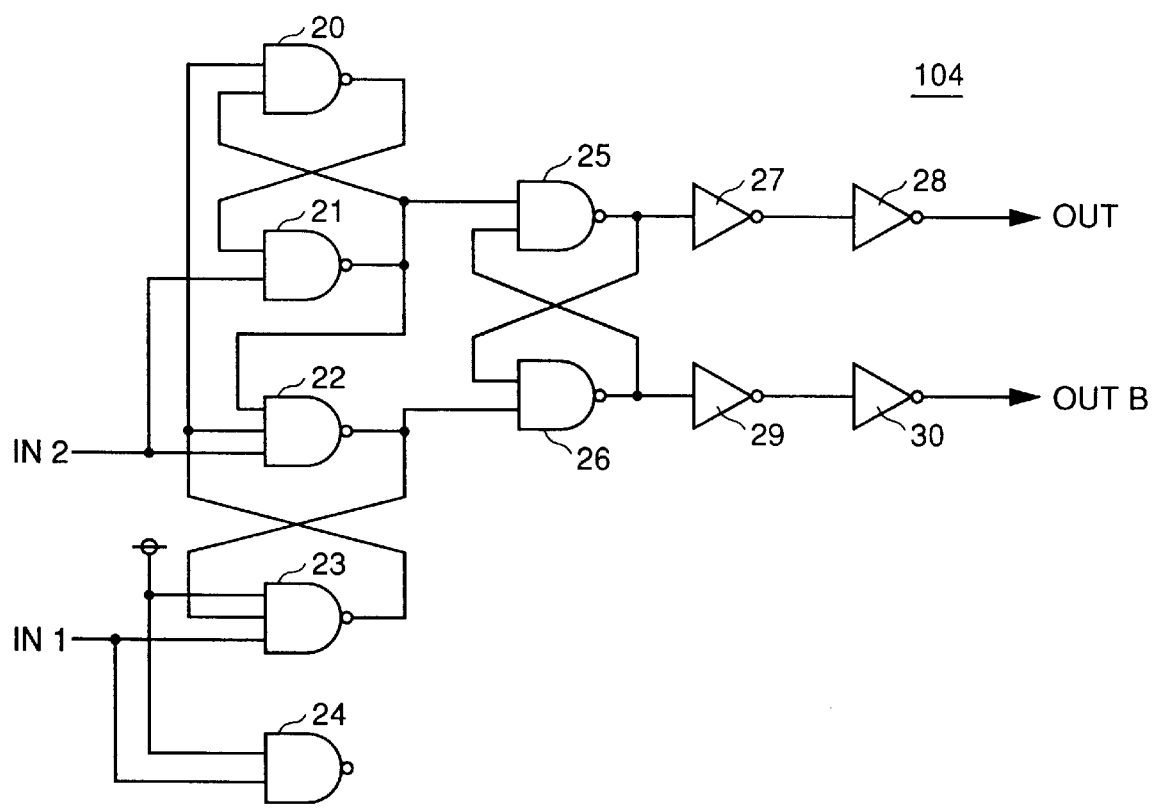
FIG. 7 is a circuit diagram showing a structure of a phase detector 104.

Phase detectors 104A, 104B and 104C have the same structures respectively. A structure of phase detector 104 (corresponding to 104A 104C each) is described below. As shown in FIG. 7, phase detector 104 includes NAND circuits 20–26 and inverters 27–30.

NAND circuit 20 receives respective outputs of NAND circuits 23 and 21. NAND circuit 21 receives an output of NAND circuit 20 and signal IN2 on an input node IN2. NAND circuit 22 receives respective outputs of NAND circuits 21 and 23 and signal IN2. NAND circuit 24 receives signal IN1 on an input node IN1 and supply voltage. NAND circuit 23 receives supply voltage, an output of NAND circuit 22 and signal IN1.

NAND circuit 25 receives respective outputs of NAND circuits 21 and 26 and NAND circuit 26 receives respective outputs of NAND circuits 22 and 25.

Inverters 27 and 28 are connected in series between an output node of NAND circuit 25 and an output node OUT and signal OUT is supplied from inverter 28. Inverters 29 and 30 are connected in series to an output node of NAND circuit 26 and signal OUTB is supplied from inverter 30.

Figure 8:
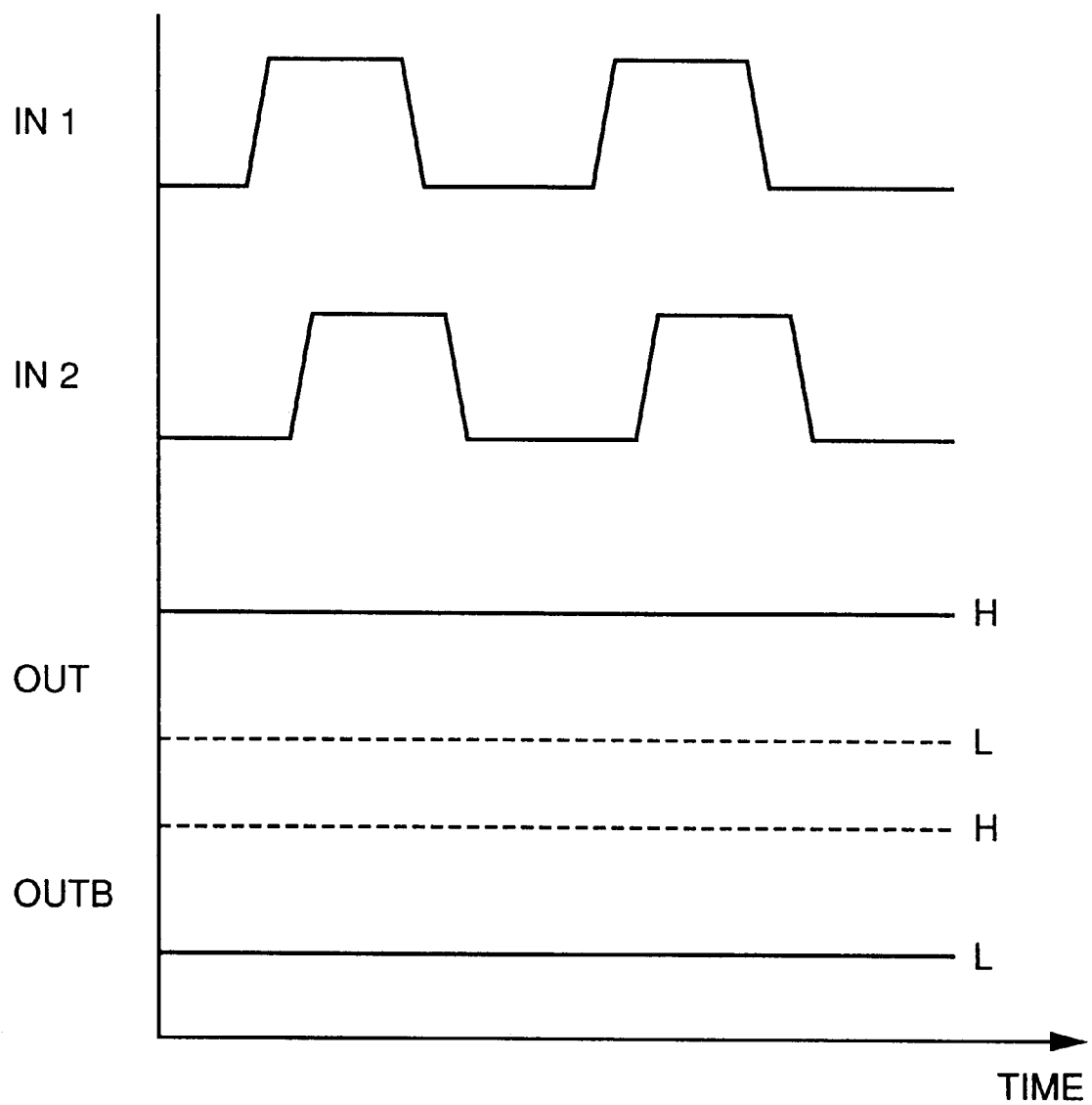
FIGS. 8 and 9 illustrate an operation of the phase detector 104.
Figure 9:
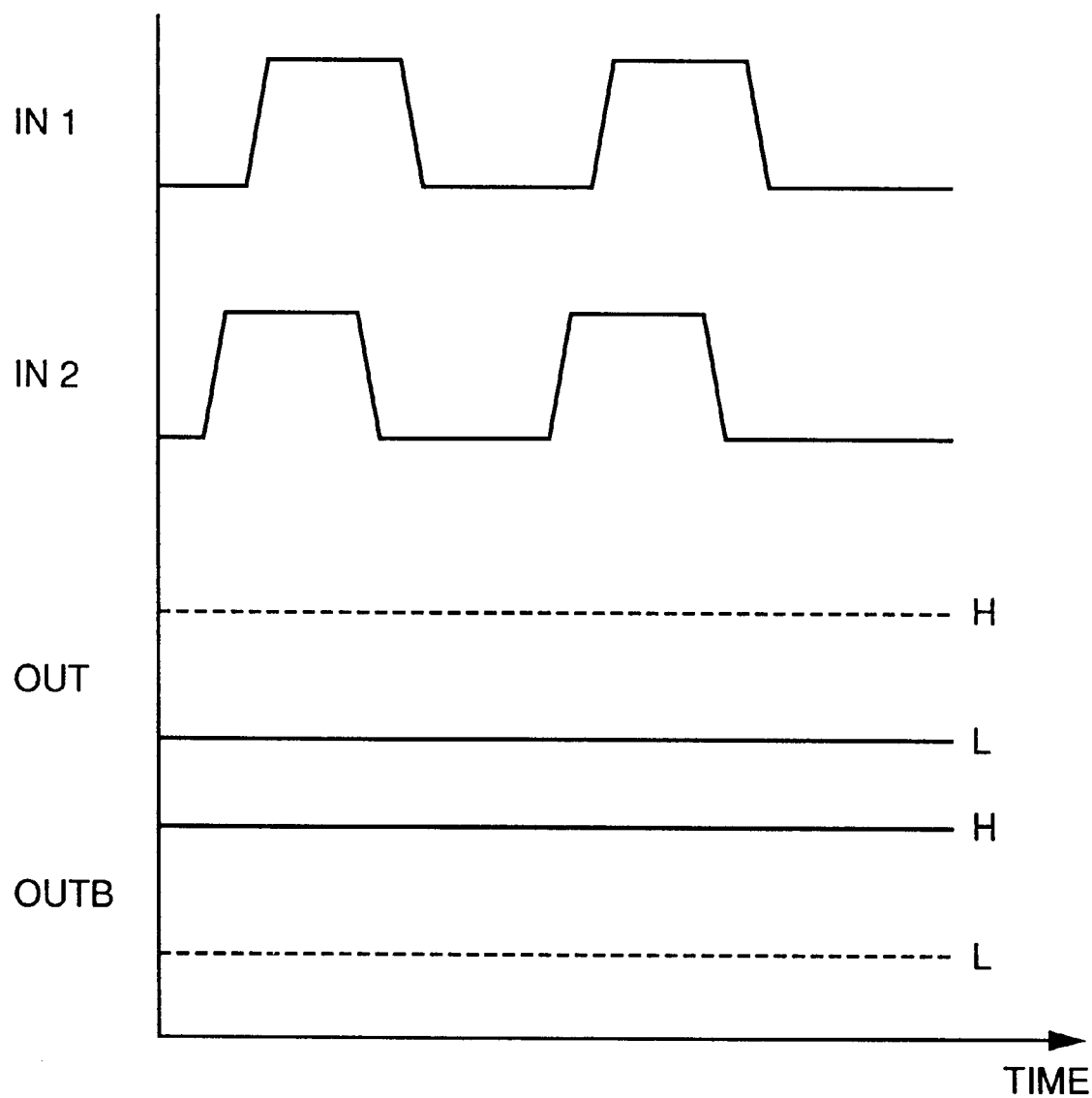

As shown in FIG. 8, if the rise of signal IN2 is later than that of signal IN1, signal OUT has "H" level (signal OUTB has "L" level). As shown in FIG. 9, if the rise of signal IN2 is earlier than that of signal IN1, signal OUT has "L" level (signal OUTB has "H" level).

Referring to FIG. 5, phase detector 104A receives signal M0a at its input node IN1 and signal M1a at its input node IN2 and outputs signal CA from its output node OUT. Phase detector 104B receives signal M0a at its input node IN1 and signal M2a at its input node IN2 and outputs signal CB from its output node OUT. Phase detector 104C receives signal M0a at its input node IN1 and signal M3a at its input node IN2 and outputs signal CC from its output node OUT.

Signals CA, CB and CC represent result of comparison between signal M0a and signals M1a, M2a and M3a.

Figure 10:
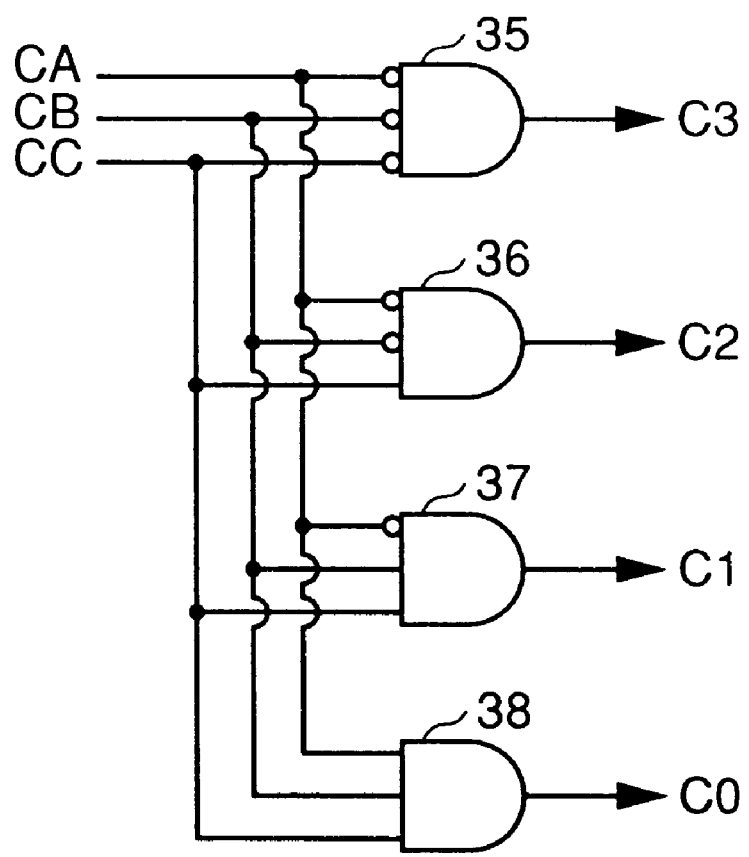
FIG. 10 is a circuit diagram showing a structure of a code generator 106.

Code generator 106 receives signals CA, CB and CC to generate code signals C0–C3. As shown in FIG. 10, code generator 106 includes logic circuits 35–38 receiving signals CA, CB and CC. Logic circuits 35, 36, 37 and 38 output code signals C3, C2, C1 and C0 respectively.

Code signal C3 is at H level when all of the signals CA, CB and CC are at L level and is at L level otherwise. Code signal C2 is at H level when signals CA and CB are at L level and signal CC is at H level and is at L level otherwise. Code signal C1 is at H level when signal CA is at L level and signals CB and CC are at H level and is at L level otherwise. Code signal C0 is at H level when all of the signals CA, CB and CC are at H level and is at L level otherwise.

Output buffers 103#0–103#7 shown in FIG. 1 are described below. Output buffers 103#0–103#7 are connected to a data input/output line L. Output buffer 103#i receives read data RDi and ZRDi from data input/output line L and outputs corresponding data to data input/output pin DQ (i) (i=0–7). In the drawing, RD (0:7) represents RD0 . . . , RD7 and ZRD (0:7) represents ZRD0, . . . , ZRD7.

Operation timing of output buffers 103#0–103#7 is determined by output clock signals CLK (0)–(7).

Figure 11:
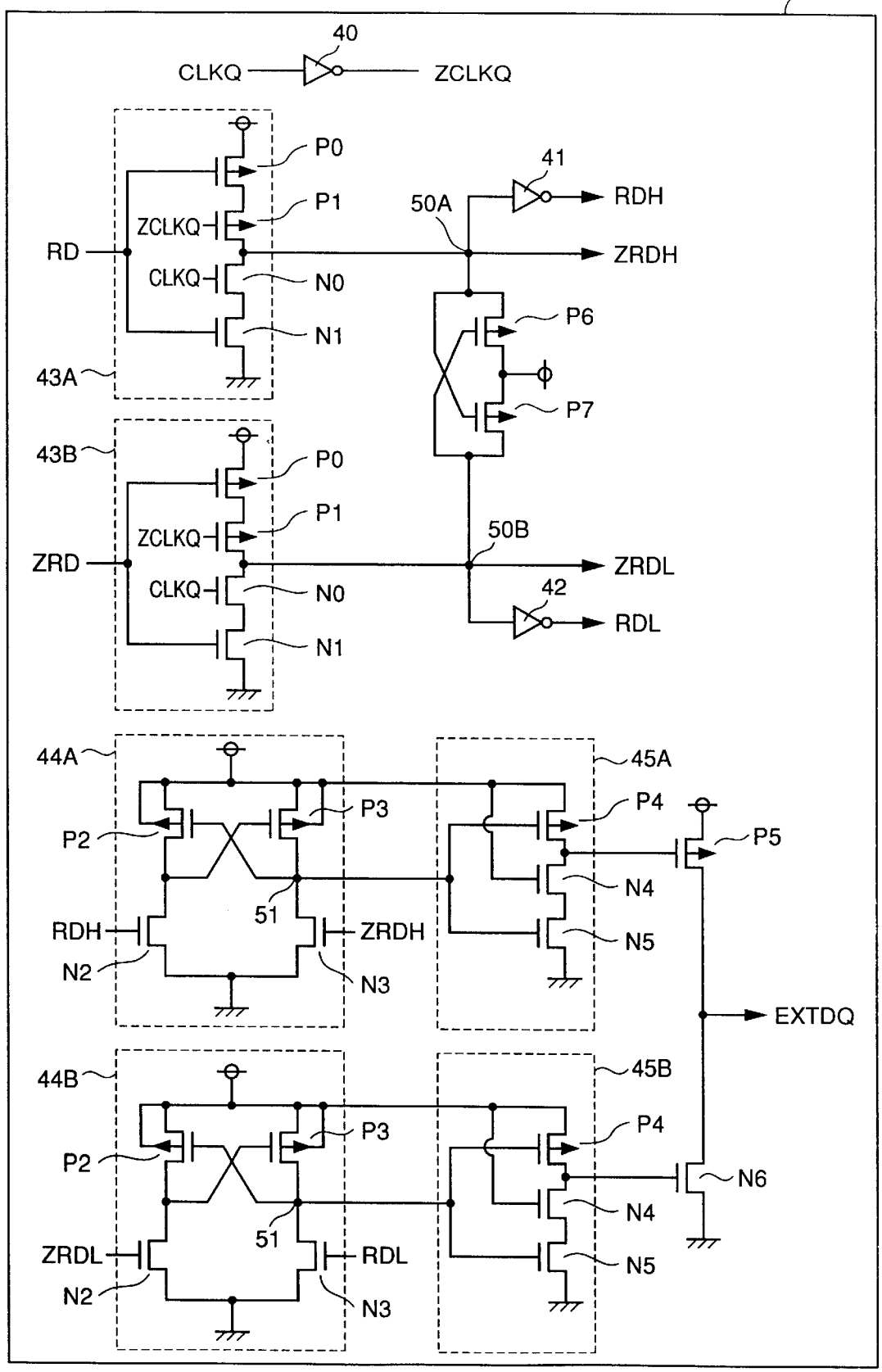
FIG. 11 is a circuit diagram showing a structure of an output buffer 103.

Output buffers 103#0–103#7 have the same structures respectively. As shown in FIG. 11, output buffer 103 (corresponding to 103#0–103#7 each) includes inverters 40–42, circuits 43A and 43B having transistors P0, P1, N0 and N1, circuits 44A and 44B having transistors P2, P3, N2 and N3, circuits 45A and 45B having transistors P4, N4 and N5, and transistors P5, P6, P7 and N6. Transistors P0–P7 are PMOS transistors and transistors N0–N6 are NMOS transistors.

Clock signal CLKQ and signals RD and ZRD complementary to each other are supplied to output buffer 103. Signal EXTDQ is output from output buffer 103. Signal EXTDQ is supplied to any external unit from a corresponding data input/output pin (DQ (0)–(7)).

Inverter 40 outputs clock signal ZCLKQ which is an inverted version of dock signal CLKQ.

Circuits 43A and 43B are described below. Transistors P0, P1, N0 and N1 are connected in series between the supply voltage and the ground voltage. Transistor P1 receives clock signal ZCLKQ at its gate and transistor N0 receives dock signal CLKQ at its gate.

In circuit 43A, transistors P0 and N1 receive signal RD at their gates and signal ZRDH is output from a connection node 50A between transistors P1 and N0.

In circuit 43B, transistors P0 and N1 receive signal ZRD at their gates and signal ZRDL is output from a connection node 50B between transistors P1 and N0.

Inverter 41 inverts signal ZRDH and outputs signal RDH. Inverter 42 inverts signal ZRDL and outputs signal RDL. Transistor P6 is connected between node 50A and the supply voltage and transistor P7 is connected between the supply voltage and node 50B. Transistor P6 receives signal ZRDL at its gate and transistor P7 receives signal ZRDH at its gate.

Circuits 44A and 44B are described below. Transistors P2 and N2 are connected in series between the supply voltage and the ground voltage, and transistors P3 and N3 are connected in series between the supply voltage and the ground voltage. The gate of transistor P3 is connected to a connection node between transistors P2 and N2 and the gate of transistor P2 is connected to a connection node 51 between transistors P3 and N3.

In circuit 44A, transistor N2 receives signal RDH at its gate and transistor N3 receives signal ZRDH at its gate. In circuit 44B, transistor N2 receives signal ZRDL at its gate and transistor N3 receives signal RDL at its gate.

Circuits 45A and 45B are described below. Transistors P4, N4 and N5 are connected in series between the supply voltage and the ground voltage. The gate of transistor N4 receives the supply voltage. In circuit 45A, respective gates of transistors P4 and N5 are connected to node 51 in circuit 44A. In circuit 45B, respective gates of transistors P4 and N5 are connected to node 51 in circuit 44B.

Transistors P5 and N6 are connected between the supply voltage and the ground voltage. The gate of transistor P5 is connected to a connection node between transistors P4 and N4 in circuit 45A, and the gate of transistor N6 is connected to a connection node between transistors P4 and N4 in circuit 45B. Signal EXTDQ is output from a connection node between transistors P5 and N6.

Figure 12:
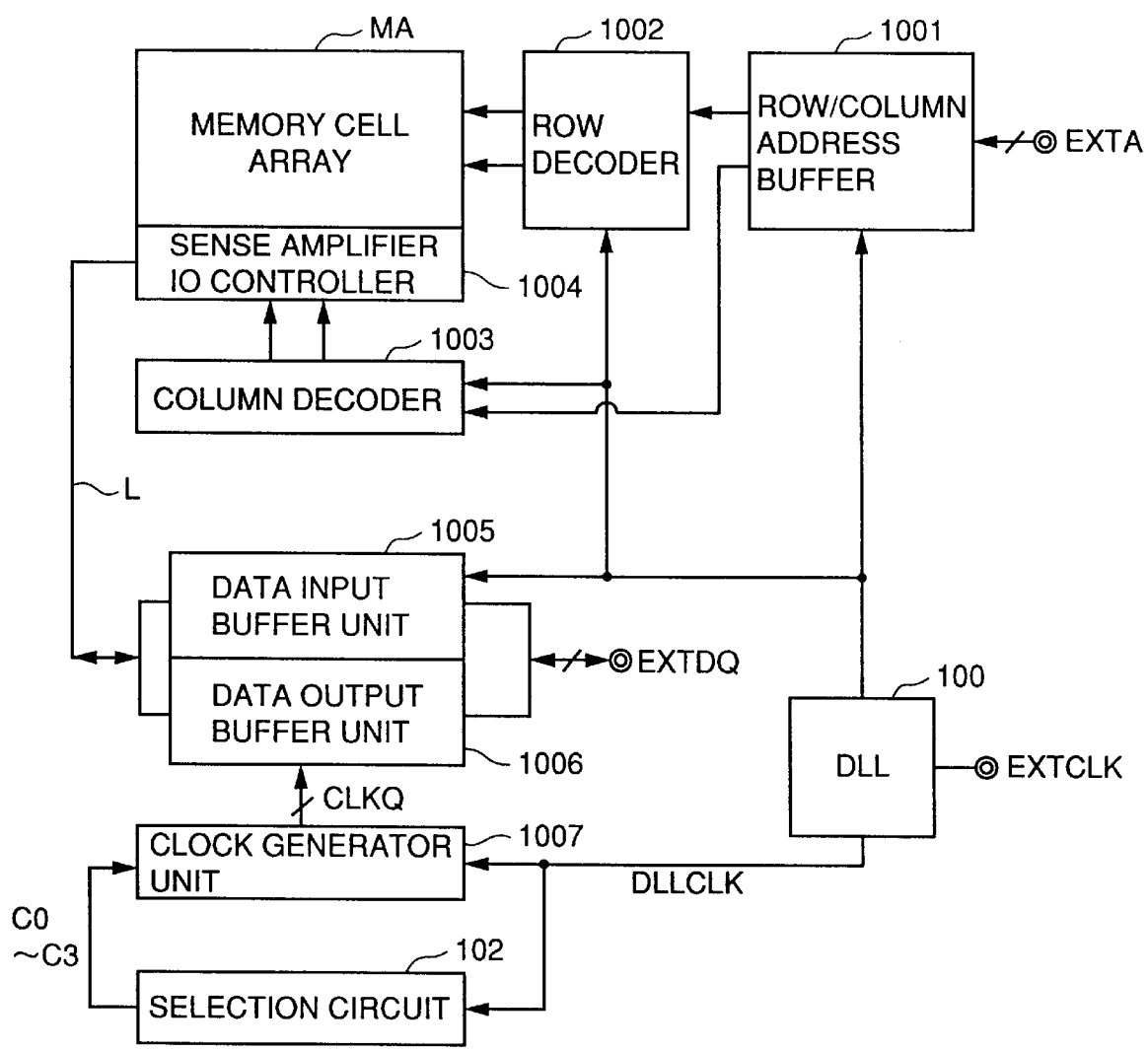
FIG. 12 is a block diagram generally showing an entire structure of the semiconductor integrated circuit 1000 according to the first embodiment.

An entire structure of semiconductor integrated circuit 1000 is now described in conjunction with FIG. 12. As shown in FIG. 12, semiconductor integrated circuit 1000 includes DLL circuit 100, a selection circuit 102, a memory cell array MA having a plurality of memory cells arranged in a matrix of rows and columns, a plurality of word lines provided correspondingly to the rows, and a plurality of bit lines provided correspondingly to the columns, a row/column address buffer 1001 taking external address EXTA therein, a row decoder 1002 decoding a row address supplied from row/column address buffer 1001 to select a row, and a column decoder 1003 decoding a column address supplied from row/column address buffer 1001.

Row/column address buffer 1001, row decoder 1002 and column decoder 1003 each operate synchronously with a clock signal supplied from a clock buffer 401 described below that is included in DLL circuit 100.

Semiconductor integrated circuit 1000 further includes a sense amplifier for amplifying a potential difference of paired bit lines, an IO (IO: input output) controller controlling transmission of data read from a selected memory cell to data input/output line L or transmission of data on a data transmission line to a selected memory cell according to a column selection signal output by column decoder 1003, a data input buffer unit 1005 taking in data on a data input/output pin EXTDQ (DQ (0), DQ (1), . . . ) to output the data to data input/output line L, a data output buffer unit 1006 taking in data on data input/output line L to output the data to data input/output pin EXTDQ, and a clock generator unit 1007 generating clock signal CLKQ determining operation timing of data input buffer unit 1005 and data output buffer unit 1006. In FIG. 12, the sense amplifier and the IO controller are shown in one block 1004.

Data output buffer unit 1006 includes output buffers 103#0–103#7 described above. Clock generator unit 1007 includes clock generators P0A, P0B, P1A–P1D, P2A and P2B.

When a write command is issued, data received by data input buffer unit 1005 is written into a selected memory cell.

When a read command is issued, data in a selected memory cell is supplied to any external unit via data output buffer unit 1006.

Figure 13:
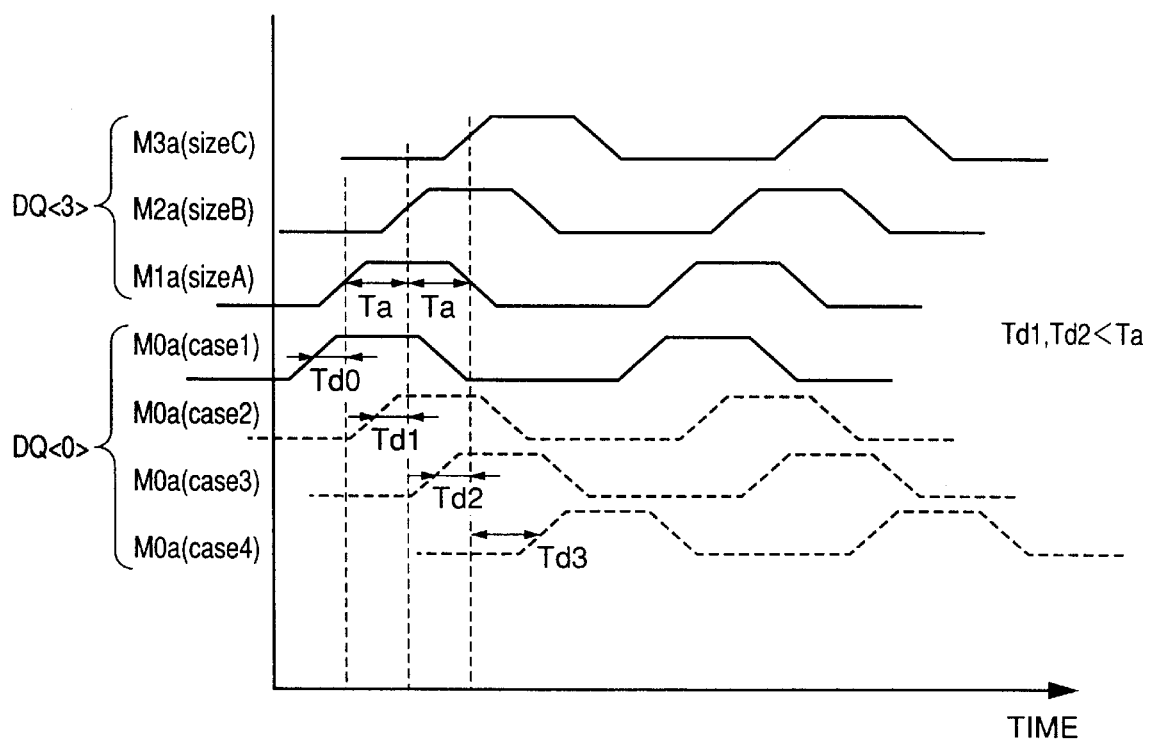
FIG. 13 illustrates signals of the selection circuit 102 according to the first embodiment.

An operation of semiconductor integrated circuit 1000 according to the first embodiment is described now in conjunction with FIGS. 13 and 14.

A condition that all of the signals CA, CB and CC generated by selection circuit 102 have H level is herein referred to as case 1, a condition that signal CA has L level and signals CB and CC have H level is referred to as case 2, a condition that signals CA and CB have L level and signal CC has H level is referred to as case 3, and a condition that all of the signals CA, CB and CC have L level is referred to as case 4. A half cycle of signal M1a (M2a, M3a) is supposed to be "2×Ta."

Signals M1a and M2a have a phase difference of Ta, and signals M2a and M3a have a phase difference of Ta. The phase of signal M0a is shifted through a transition from case 1 to case 4.

Referring to FIG. 13, for case 1, signal M0a has its timing close to that of signal M1a. The difference between respective rise times of signals M0a and M1a is Td0.

For case 2, the rise time of signal M0a is between respective rise times of signals M1a and M2a. The difference between respective rise times of signals M0a and M2a is Td1.

For case 3, the rise time of signal M0a is between respective rise times of signals M2a and M3a. The difference between respective rise times of signals M0a and M3a is Td2.

For case 4, the rise time of signal M0a is close to that of signal M3a. The difference between respective rise times of signals M0a and M3a is Td3. Here, there is a relation Td1, Td2<Ta.

Referring to FIG. 14, for case 1, code signal C0 has H level and other code signals have L level. In clock generator P2 (P2A, P2B), size "A" is selected. In clock generator P1 (P1A–P1D), size "A" is selected.

For case 2, code signal C1 has H level and other code signals have L level. In dock generator P2, size "B" is selected. In clock generator P1, size "A" is selected.

For case 3, code signal C2 has H level and other code signals have L level. In clock generator P2, size "C" is selected. In clock generator P1, size "B" is selected.

For case 4, code signal C3 has H level and other code signals have L level. In clock generator P2, size "C" is selected. In clock generator P1, size "B" is selected.

In this way, semiconductor integrated circuit 1000 according to the first embodiment enables the timing of output clock signals to conform to the timing of the latest output clock signal CLKQ (0).

Data can be matched with each other in output timing by adjusting the size of the clock generators, and accordingly skew in data output timing between DQs can be corrected. The margin of data output timing can thus be improved.

Second Embodiment

Figure 15:
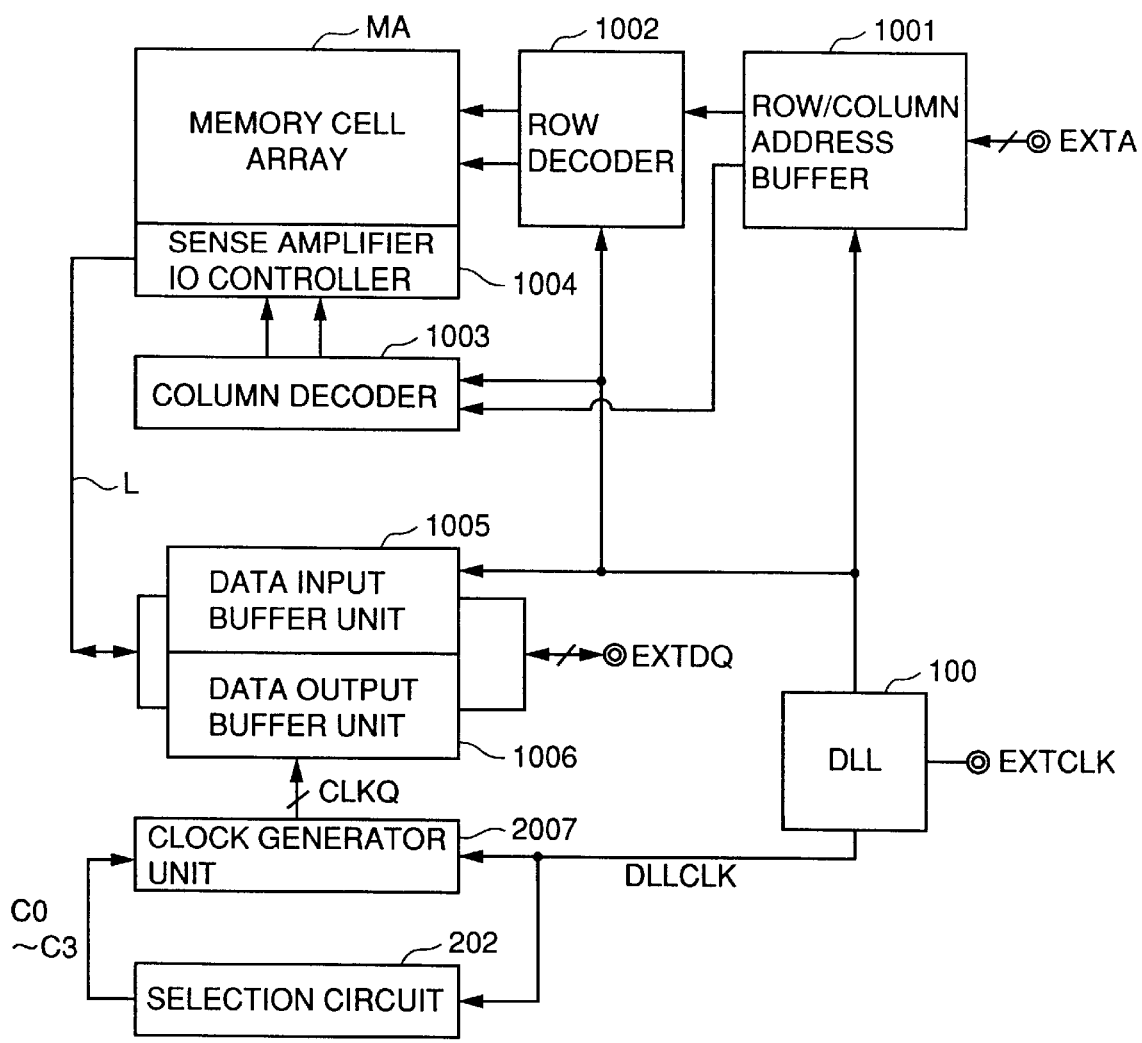
FIG. 15 is a diagram generally showing an entire structure of a semiconductor integrated circuit 2000 according to a second embodiment.

A semiconductor integrated circuit 2000 according to the second embodiment is now described. As shown in FIG. 15, semiconductor integrated circuit 2000 according to the second embodiment includes a selection circuit 202 instead of selection circuit 102 and includes a dock generator unit 2007 instead of dock generator unit 1007. Clock generator unit 2007 includes clock generators P0A, P0B, P3A–P3D, P4A and P4B.

Figure 16:
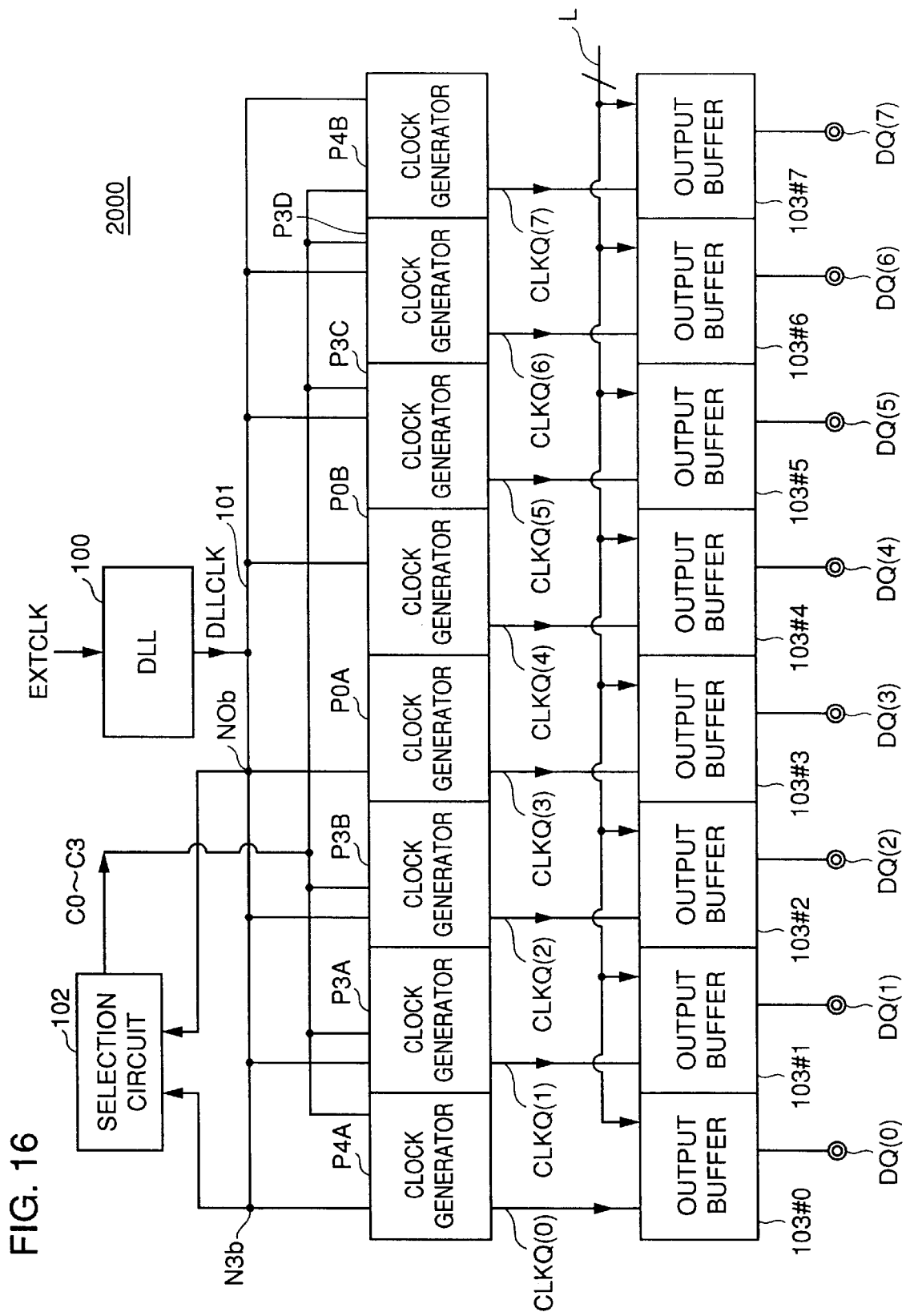
FIG. 16 is a block diagram generally showing a structure of a major part of the semiconductor integrated circuit 2000 according to the second embodiment.

As shown in FIG. 16, clock generators P0A and P0B are placed closest to an output node of a DLL circuit 100. Clock generators P3A and P3B and clock generators P3C and P3D are arranged with clock generators P0A and P0B interposed therebetween. Clock generators P4A and P4B are further arranged with clock generators P3A–P3D interposed therebetween.

The clock generators respectively generate output clock signals based on internal clock signal DLLCLK supplied via a line 101 to determine data output timing.

Respective output clock signals from clock generators P4A, P3A, P3B and P0A are represented by CLKQ (0), CLKQ (1), CLKQ (2) and CLKQ (3) respectively. Respective output clock signals from clock generators P0B, P3C, P3D and P4B are represented by CLKQ (4), CLKQ (5), CLKQ (6) and CLKQ (7) respectively.

Clock generators P3A–P3D have the same structures respectively and clock generators P4A and P4B have the same structures respectively.

According to the second embodiment, circuit size (operation speed) of clock generators P3A–P3D, P4A and P4B is adjusted to allow the timing of output clock signals to conform to the timing of the earliest output clock signal CLKQ (3).

The structure of clock generators P0A and P0B is as discussed above.

Figure 17:
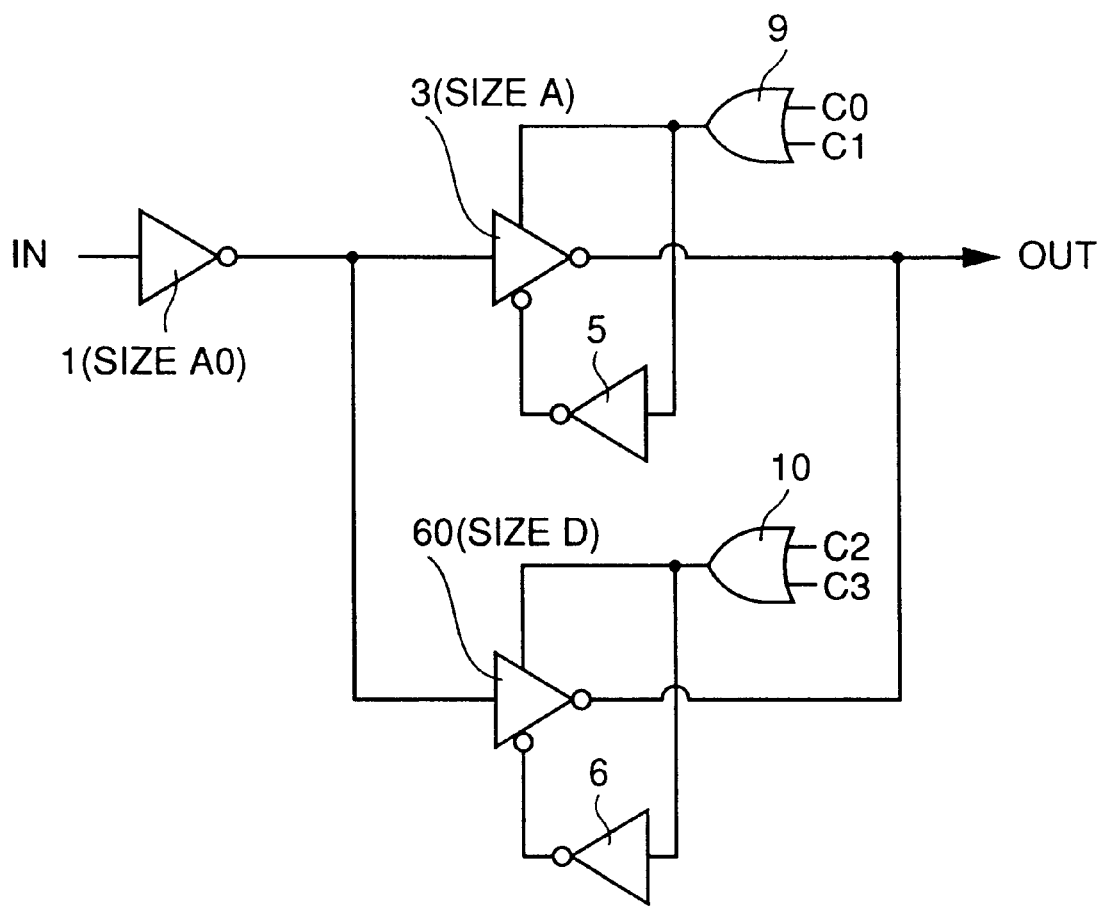
FIG. 17 is a circuit diagram showing a structure of a clock generator P3.

A structure of dock generator P3 (corresponding to P3A–P3D each) is described in conjunction with FIG. 17. Clock generator P3 includes inverters 1, 3, 5, 6 and 60 and OR circuits 9 and 10. Inverter 1 has a circuit size "A1," inverter 3 has a circuit size "A" and inverter 60 has a circuit size "D" (A<D). Inverter 1 inverts signal IN on an input node IN, and inverters 3 and 60 each output the inverted version of an output of inverter 1 to a node OUT.

OR circuit 9 receives code signals C0 and C1 from selection circuit 202 and OR circuit 10 receives code signals C2 and C3 from selection circuit 202. Inverters 5 and 6 invert respective outputs of OR circuits 9 and 10. Inverter 3 outputs a signal according to respective outputs of OR circuit 9 and inverter 5 and inverter 60 outputs a signal according to respective outputs of OR circuit 10 and inverter 6.

Figure 18:
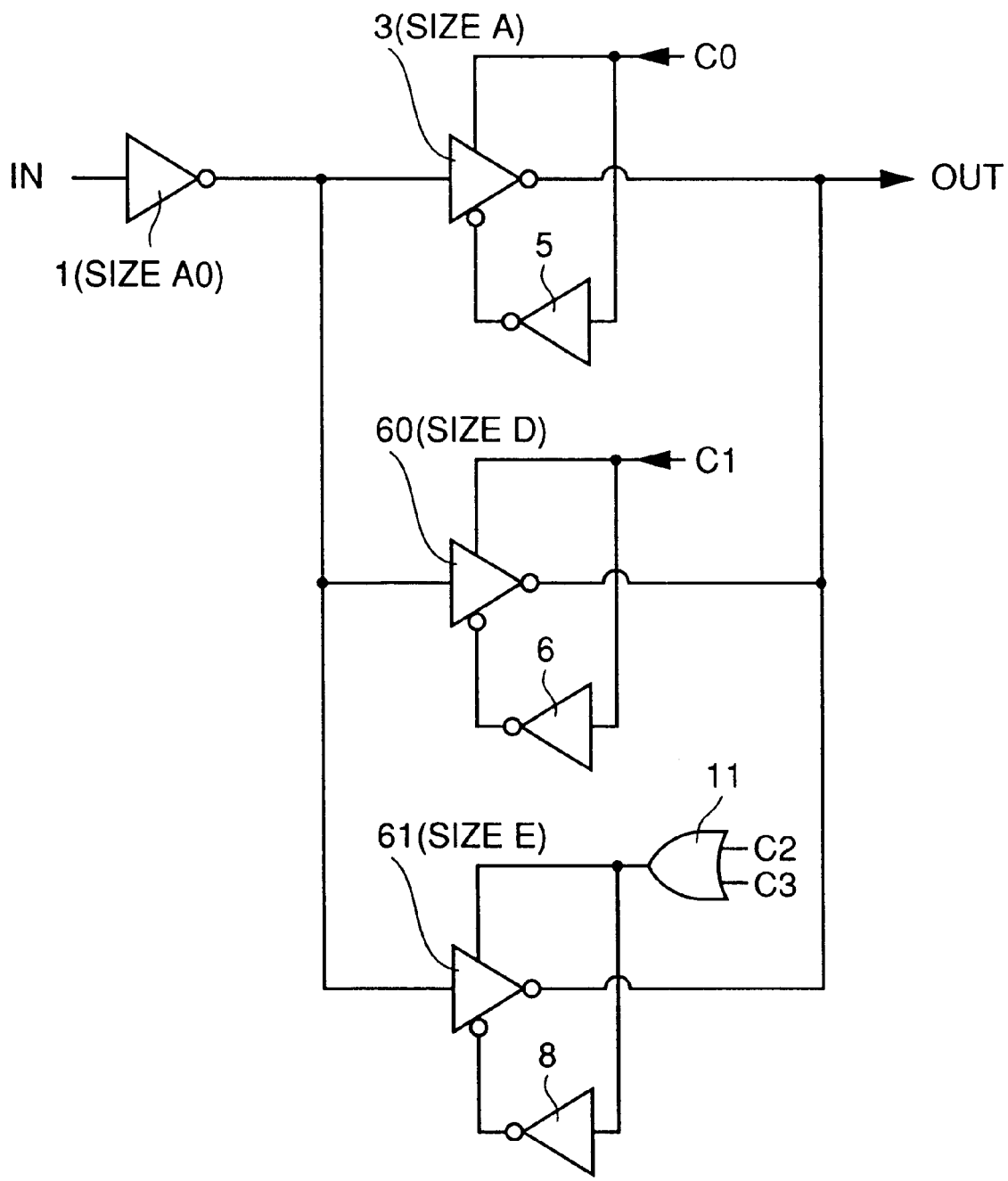
FIG. 18 is a circuit diagram showing a structure of a clock generator P4.

A structure of clock generator P4 (corresponding to P4A and P4B each) is described in conjunction with FIG. 18. Clock generator P4 includes inverters 1, 3, 5, 6, 8, 60 and 61 and an OR circuit 11. Inverter 1 has a circuit size "A1, " inverter 3 has a circuit size "A," inverter 60 has a circuit size "D" and inverter 61 has a circuit size "E" (A<D<E). Inverter 1 inverts a signal on an input node IN and inverters 3, 60 and 61 each output the inverted version of an output of inverter 1 to a node OUT.

OR circuit 11 receives code signals C2 and C3 from selection circuit 202. Inverters 5, 6 and 8 respectively invert code signal C0, code signal C1 and an output of OR circuit 11. Inverter 3 outputs a signal according to code signal C1 and an output of inverter 5, inverter 60 outputs a signal according to code signal C1 and an output of inverter 6 and inverter 61 outputs a signal according to respective outputs of OR circuit 11 and inverter 8.

Sizes D and E are determined by the gate width W and the gate length L of a transistor and operation speed varies depending on the size.

In clock generator P3, inverter 3 or 60 is selected according to code signals C0–C3. In clock generator P4, inverter 3, 60 or 61 is selected according to code signals C0–C3.

Therefore, the operation speed of clock generators P3 and P4 is changed according to code signals C0–C3.

Selection circuit 202 is described. As shown in FIG. 16 a first input node of selection circuit 202 is connected to a node N0b where clock generator P0A receives internal clock signal DLLCLK, and a second input node is connected to a node N3b where clock generator P4A receives internal clock signal DLLCLK.

Figure 19:
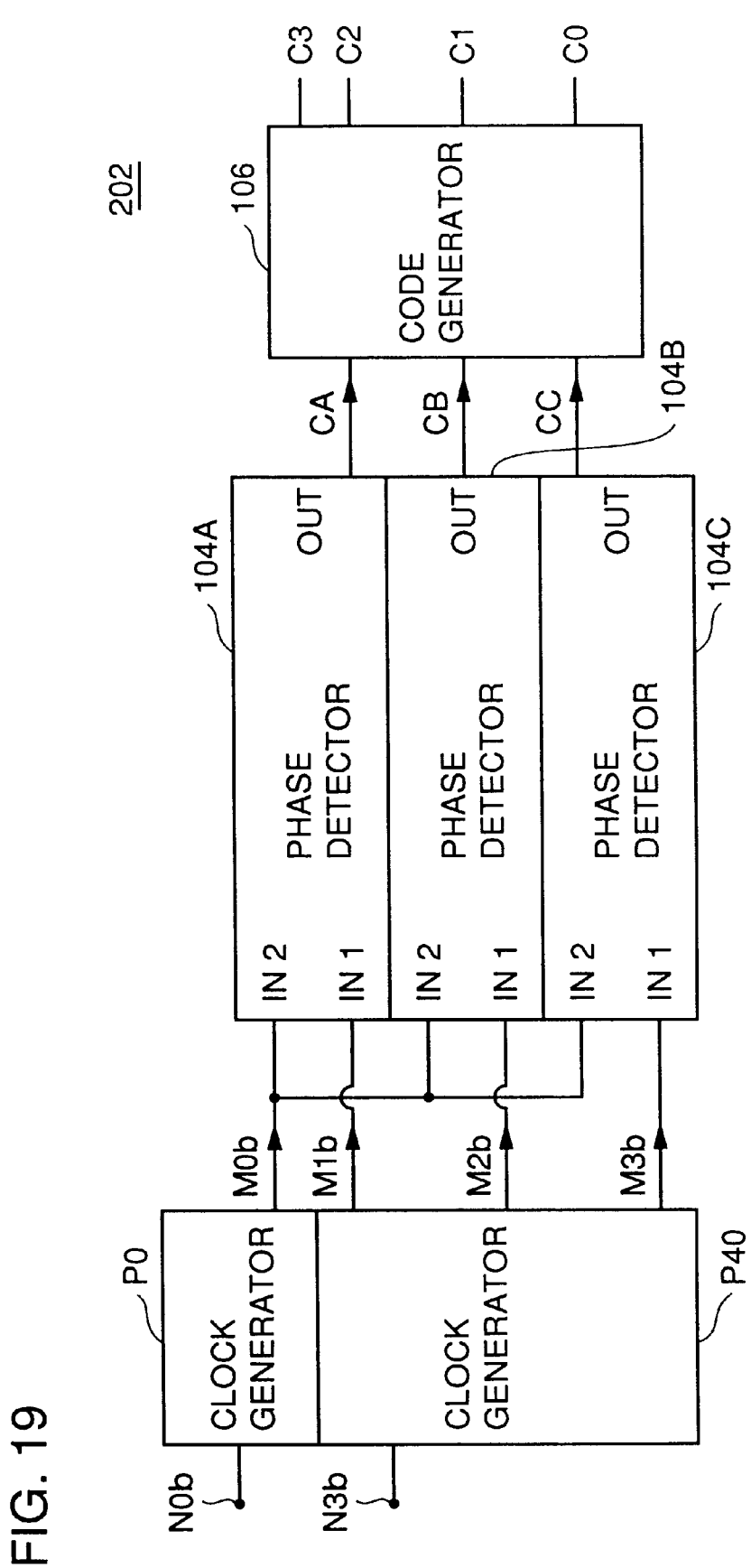
FIG. 19 is a block diagram showing a structure of a selection circuit 202.

As shown in FIG. 19, selection circuit 202 includes clock generators P0 and P40, phase detectors 104A, 104B and 104C and a code generator 106.

Clock generator P0 receives a signal on node N0b to output signal M0b. Clock generator P40 receives a signal on node N3b to output signals M1b, M2b and M3b.

Figure 20:
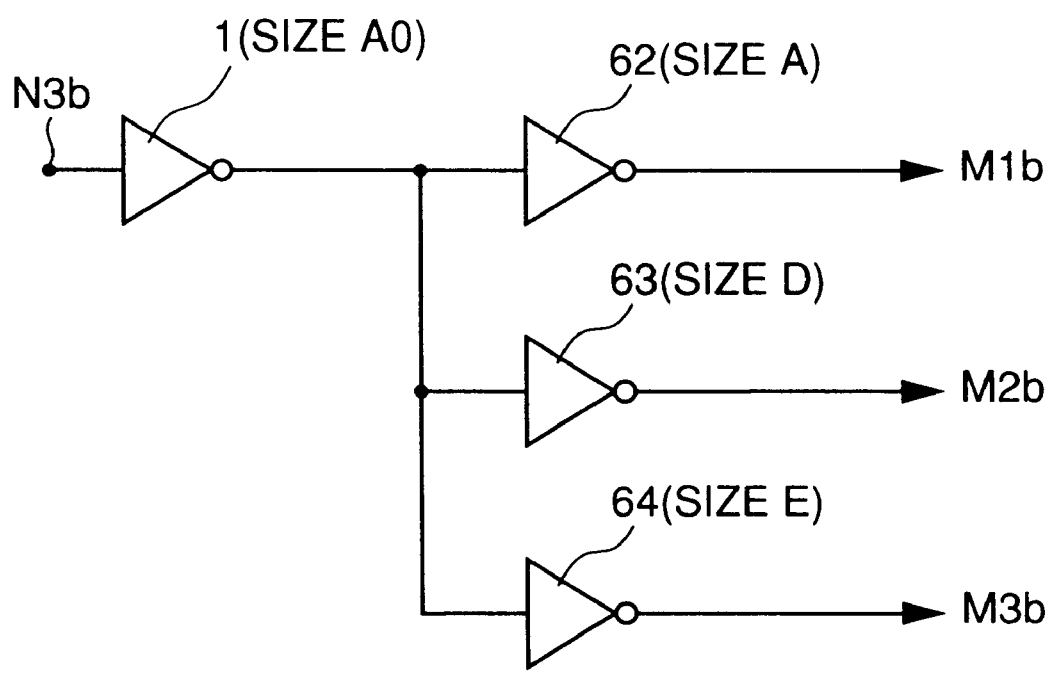
FIG. 20 is a circuit diagram showing a structure of a clock generator P40.

As shown in FIG. 20, clock generator P40 includes an inverter 1 as well as inverters 62, 63 and 64 inverting an output of inverter 1. Inverters 62, 63 and 64 respectively output respective signals M1b, M2b and M3b.

Inverter 62 has a circuit size "A" (equal to the size of inverters 2 and 3), inverter 63 has a circuit size "D" (equal to the size of inverter 60) and inverter 64 has a circuit size "E" (equal to the size of inverter 61).

Referring to FIG. 19, phase detector 104A receives signal M0b at its input node IN2 and signal M1b at its input node IN1 and outputs signal CA from its output node OUT. Phase detector 104B receives signal M0b at its input node IN2 and signal M2b at its input node IN1 and outputs signal CB from its output node OUT. Phase detector 104C receives signal M0b at its input node IN2 and signal M3b at its input node IN1 and outputs signal CC from its output node OUT. Code generator 106 receives signals CA, CB and CC to generate code signals C0–C3.

Figure 21:
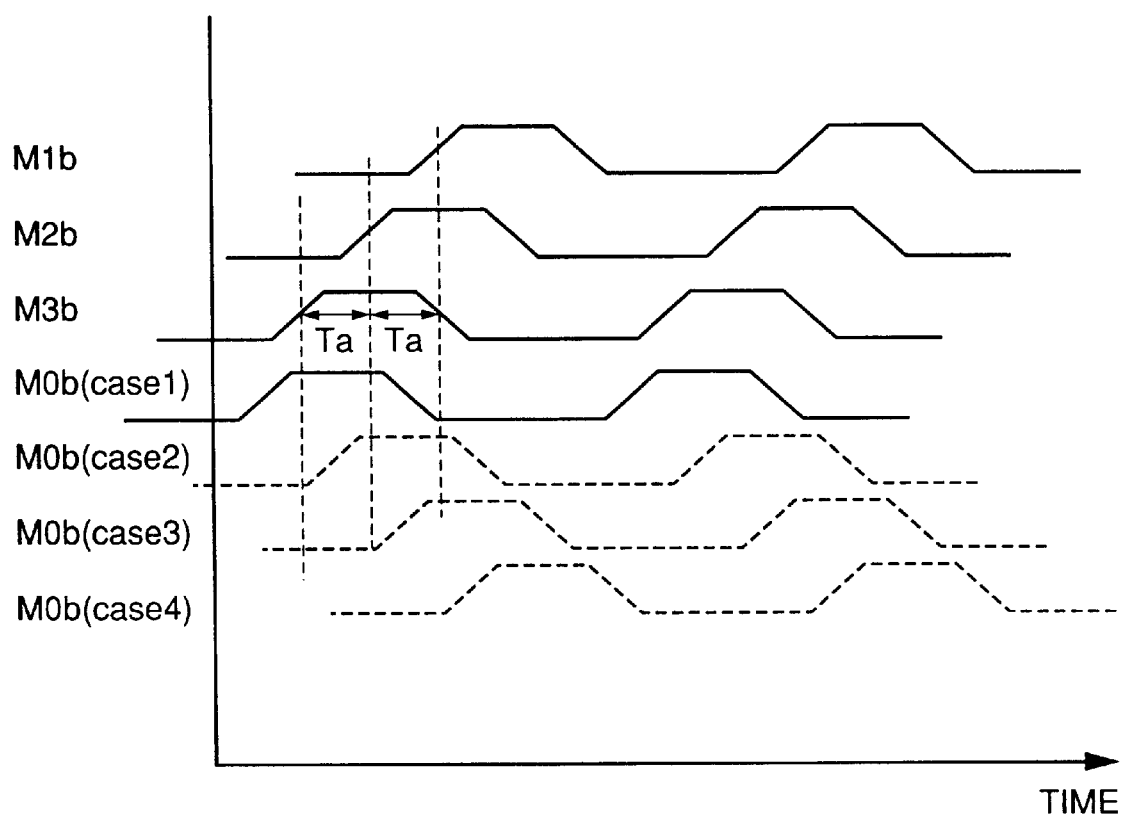
FIG. 21 illustrates signals of the selection circuit 202 according to the second embodiment.

An operation of semiconductor integrated circuit 2000 according to the second embodiment is now described in conjunction with FIGS. 21 and 22.

A condition that all of the signals CA, CB and CC generated by selection circuit 202 have H level is herein referred to as case 4, a condition that signal CA has L level and signals CB and CC have H level is referred to as case 3, a condition that signals CA and CB have L level and signal CC has H level is referred to as case 2, and a condition that all of the signals CA, CB and CC have L level is referred to as case 1. A half cycle of signal M1b (M2b, M3b) is supposed to be "2×Ta."

Signals M1b and M2b have a phase difference of Ta, and signals M2b and M3b have a phase difference of Ta. The phase of signal M0b is shifted through a transition from case 1 to case 4.

As shown in FIG. 21, for case 1, signal M0b has timing close to that of signal M3b.

For case 2, the rise time of signal M0b is between respective rise times of signals M3b and M2b.

For case 3, the rise time of signal M0b is between respective rise times of signals M2b and M1b.

For case 4, the rise time of signal M0b is close to that of signal M1b.

Referring to FIG. 22, for case 4, code signal C0 has H level and other code signals have L level. In clock generator P4 (P4A, P4B), size "A" is selected. In clock generator P3 (P3A–P3D), size "A" is selected.

For case 3, code signal C1 has H level and other code signals have L level. In clock generator P4, size "D" is selected. In clock generator P3, size "A" is selected.

For case 2, code signal C2 has H level and other code signals have L level. In clock generator P4, size "E" is selected. In clock generator P3, size "D" is selected.

For case 1, code signal C3 has H level and other code signals have L level. In clock generator P4, size "E" is selected. In clock generator P3, size "D" is selected.

In this way, semiconductor integrated circuit 2000 according to the second embodiment allows the timing of output clock signals to conform to the timing of the earliest output clock signal CLKQ (3).

Data can be matched with each other regarding the output timing by adjusting the size of the clock generators, and accordingly any skew in data output timing between DQs can be corrected. The margin of data output timing can thus be improved.

Third Embodiment

Figure 23:
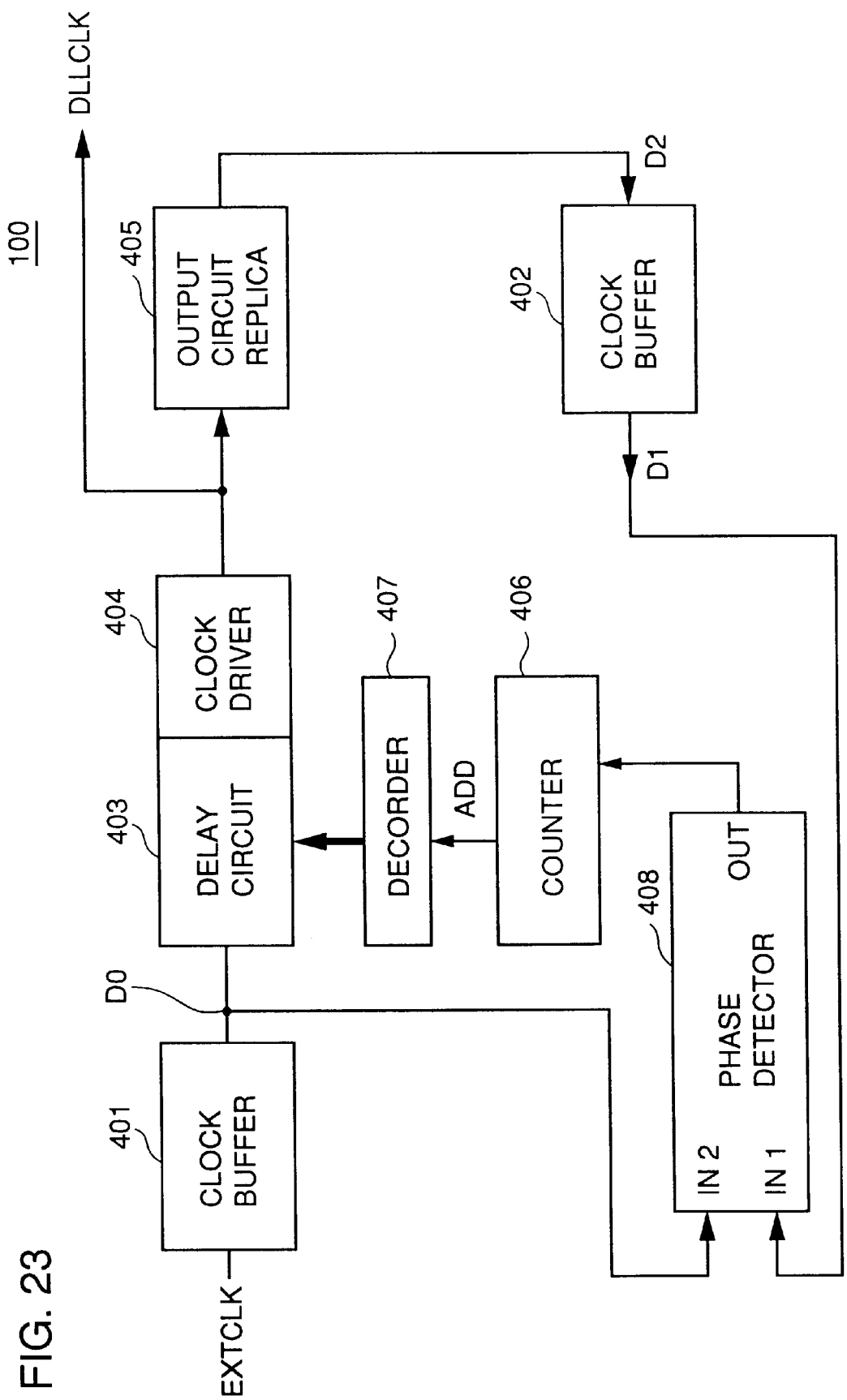
FIG. 23 is a block diagram showing a structure of a DLL circuit 100.

A semiconductor integrated circuit 3000 according to the third embodiment is now described. A DLL circuit 100 is described first. As shown in FIG. 23, DLL circuit 100 includes dock buffers 401 and 402, a delay circuit 403, a clock driver 404, an output circuit replica 405, a counter 406, a decoder 407, and a phase detector 408. Clock buffers 401 and 402 have the same size.

Clock buffer 401 receives external clock signal EXTCLK. Delay circuit 403 delays signal DO on an output node DO of clock buffer 401. Clock driver 404 drives a dock signal output from delay circuit 403 to output internal clock signal DLLCLK. A stable signal is supplied to an output buffer by clock driver 404.

Output circuit replica 405 receives internal clock signal DLLCLK. Output circuit replica 405 operates at the same speed as that of a circuit (referred to as output circuit) corresponding to a combination of clock generator P0 and output buffer 103, and has a circuit structure exhibiting the same characteristics as those of the output circuit with respect to change in temperature, voltage and the like. Output circuit replica 405 has the same delay amount as that of the output circuit. Output circuit replica 405 may or may not be the same as the output circuit regarding the circuit structure.

Clock buffer 402 takes in signal D2 on an output node D2 of output circuit replica 405. Phase detector 408 has the same structure as that of phase detector 104 discussed above. Phase detector 408 receives at its input node IN1 signal D1 on an output node D1 of dock buffer 402 and receives signal DO at its input node IN2.

Counter 406 takes a count of output of phase detector 408. Specifically, when signal OUT is at H level, up signal UP is incremented. When signal OUT is at L level, down signal DN is incremented. Decoder 407 decodes the count value ADD supplied from counter 406.

Delay circuit 403 includes a plurality of delay stages. According to an output (i.e., the value of the up signal and the value of the down signal) of decoder 407, the number of delay stages is adjusted.

By repeating such a loop and matching the timing of signal DO with that of D1, signal D2 is synchronized with external dock signal EXTCLK (i.e., respective rise times and fall times are matched with each other). Since signal D2 is accordingly synchronized with each data output timing, the relation tAC="0" is satisfied where the time interval between the dock and data output timing is tAC.

If data output timing of data input/output pins is not uniform, any data input/output pin does not meet the specification of tAC.

Then, according to the third embodiment, the phase of an internal signal of the DLL circuit, specifically the phase of signal D2 is adjusted to prevent nonuniform data output timing of data input/output pins.

Figure 24:
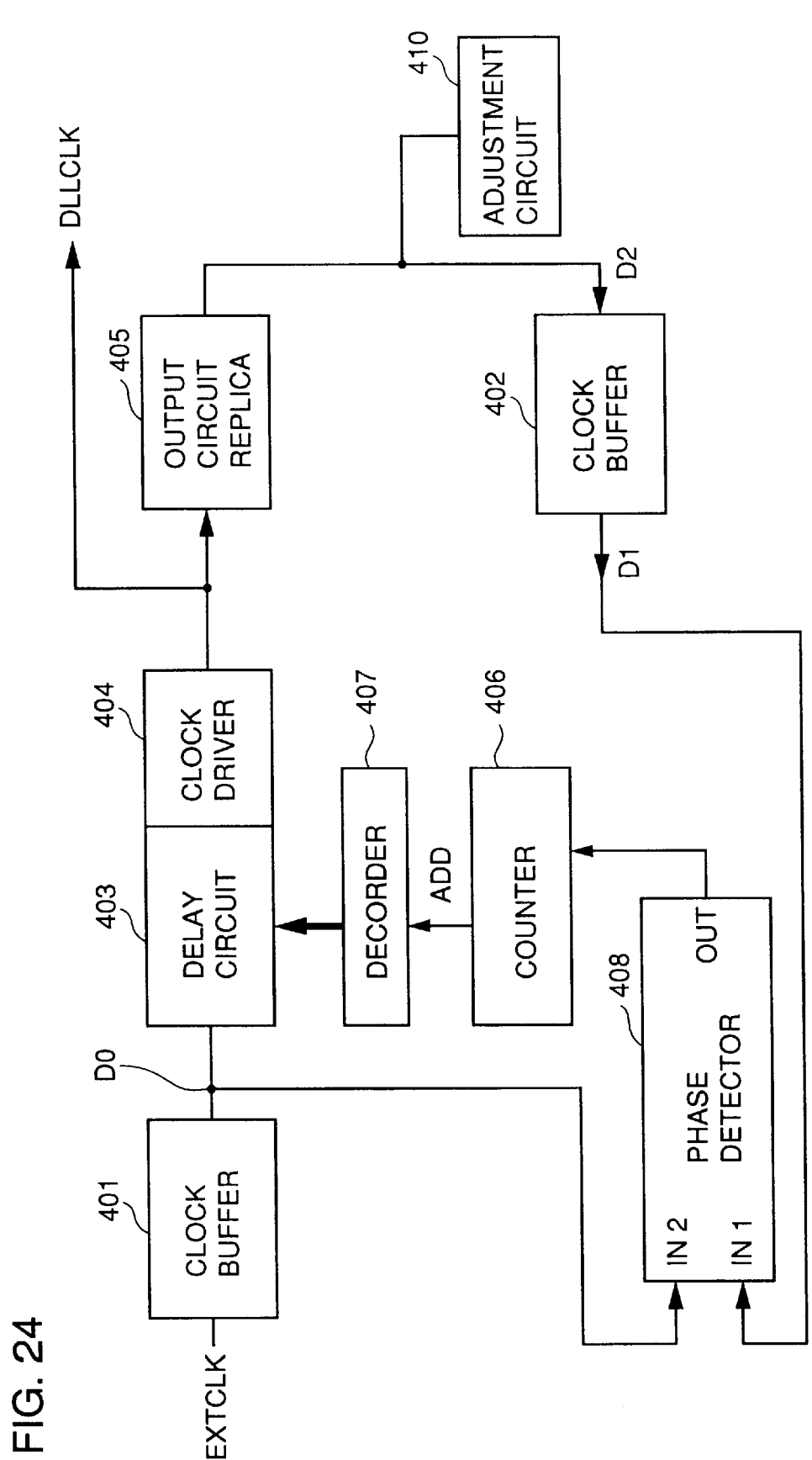
FIG. 24 is a block diagram showing a relation between the DLL circuit 100 and an adjustment circuit 410.

Semiconductor integrated circuit 3000 according to the third embodiment includes, in addition to the structure of semiconductor integrated circuit 1000, an adjustment circuit 410 (see FIG. 24) for adjusting the phase of signal D2 on node D2 in DLL circuit 100.

Figure 25:
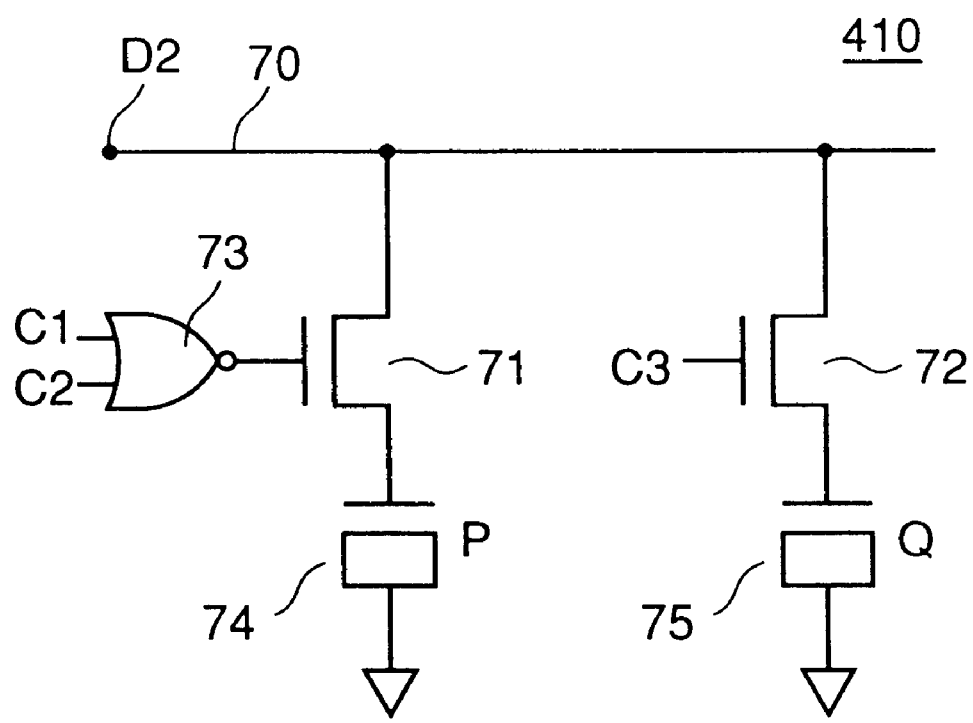
FIG. 25 is a circuit diagram showing a structure of the adjustment circuit 410.

As shown in FIG. 25, adjustment circuit 410 includes a line 70 connected to node D2, NMOS transistors 71 and 72 having one conduction terminal connected to line 70, a NOR circuit 73 and MOS capacitors 74 and 75.

NOR circuit 73 receives at its input code signals C1 and C2 from selection circuit 102. Transistor 71 receives at its gate an output of NOR circuit 73. Transistor 72 receives at its gate code signal C3 from selection circuit 102.

MOS capacitor 74 is connected between one conduction terminal of transistor 71 and the ground voltage, and MOS capacitor 75 is connected between one conduction terminal of transistor 72 and the ground voltage.

Size "P" of MOS capacitor 74 and size "Q" of MOS capacitor 75 are determined to allow, compared with the case in which code signal C0 is at H level, the phase of signal D2 to precede by Ta/2 when code signal C1 or C2 is at H level and allow the phase of signal D2 to be delayed by Ta/2 when code signal C3 is at H level. Details are described below. The conventional semiconductor integrated circuit 5000 and semiconductor integrated circuit 3000 according to the third embodiment are different from each other as follows. It is supposed here that data is output with CAS latency 2 (two). Further, tAC represents a time difference between the rise time after two clocks from the issue of a read command and the output time of data, EXTCLK represents external clock signal and EXTZCAS represents an external column address strobe signal.

Figure 26:
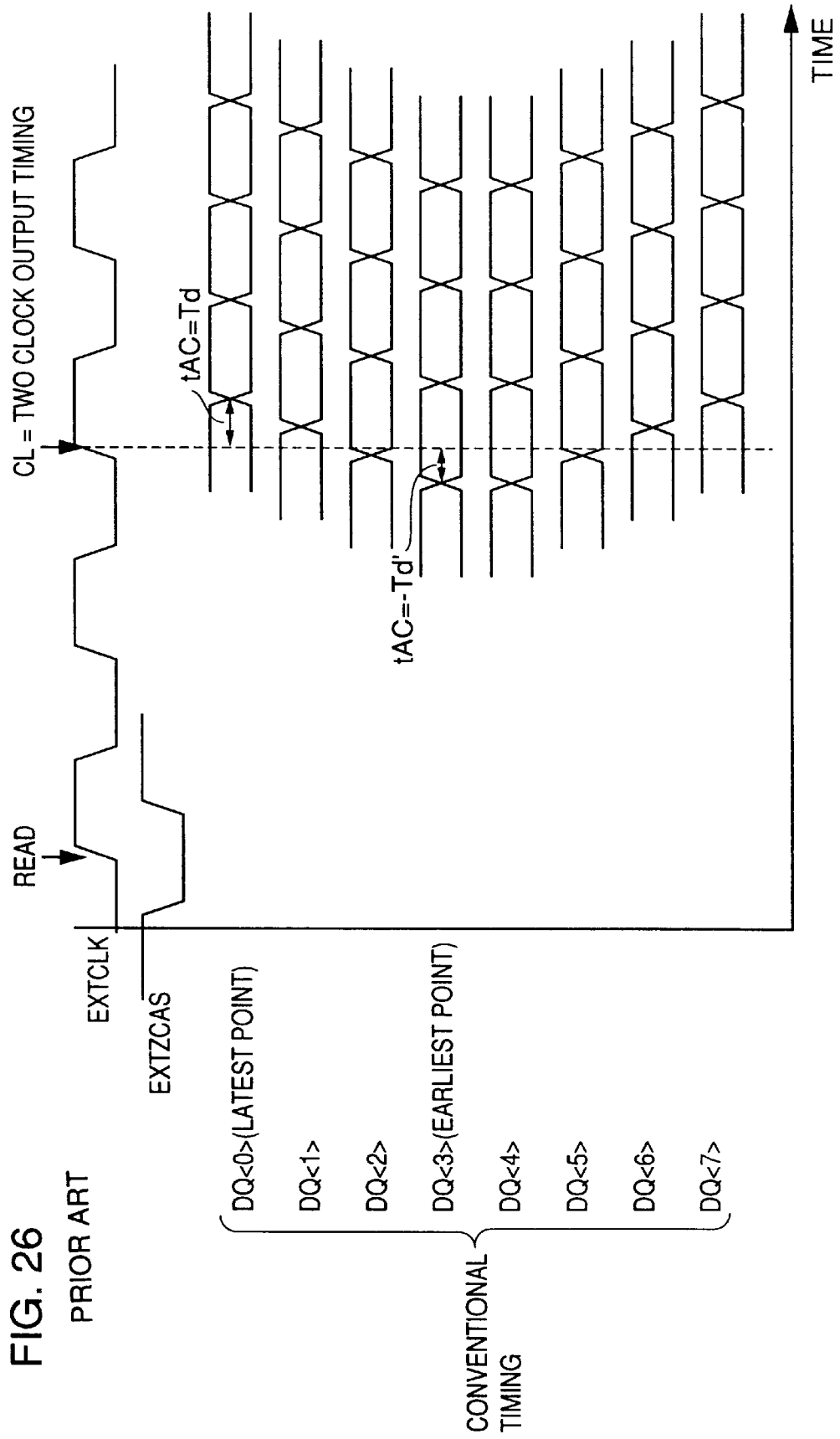
FIG. 26 illustrates nonuniform output data.

For the conventional semiconductor integrated circuit, as shown in FIG. 26, regarding data DQ (3) and DQ (4) that are output based on respective output clock signals from the clock generators located (at the earliest point) closest to the output node of the DLL circuit, the tAC=(−Td') is satisfied. Regarding data DQ (0) and DQ (7) that are output based on respective output clock signals from the clock generators located (at the latest point) remotest from the output node of the DLL circuit, the tAC=(Td) is satisfied. Therefore, the specification is difficult to satisfy regarding data input/output pins.

Figure 27:
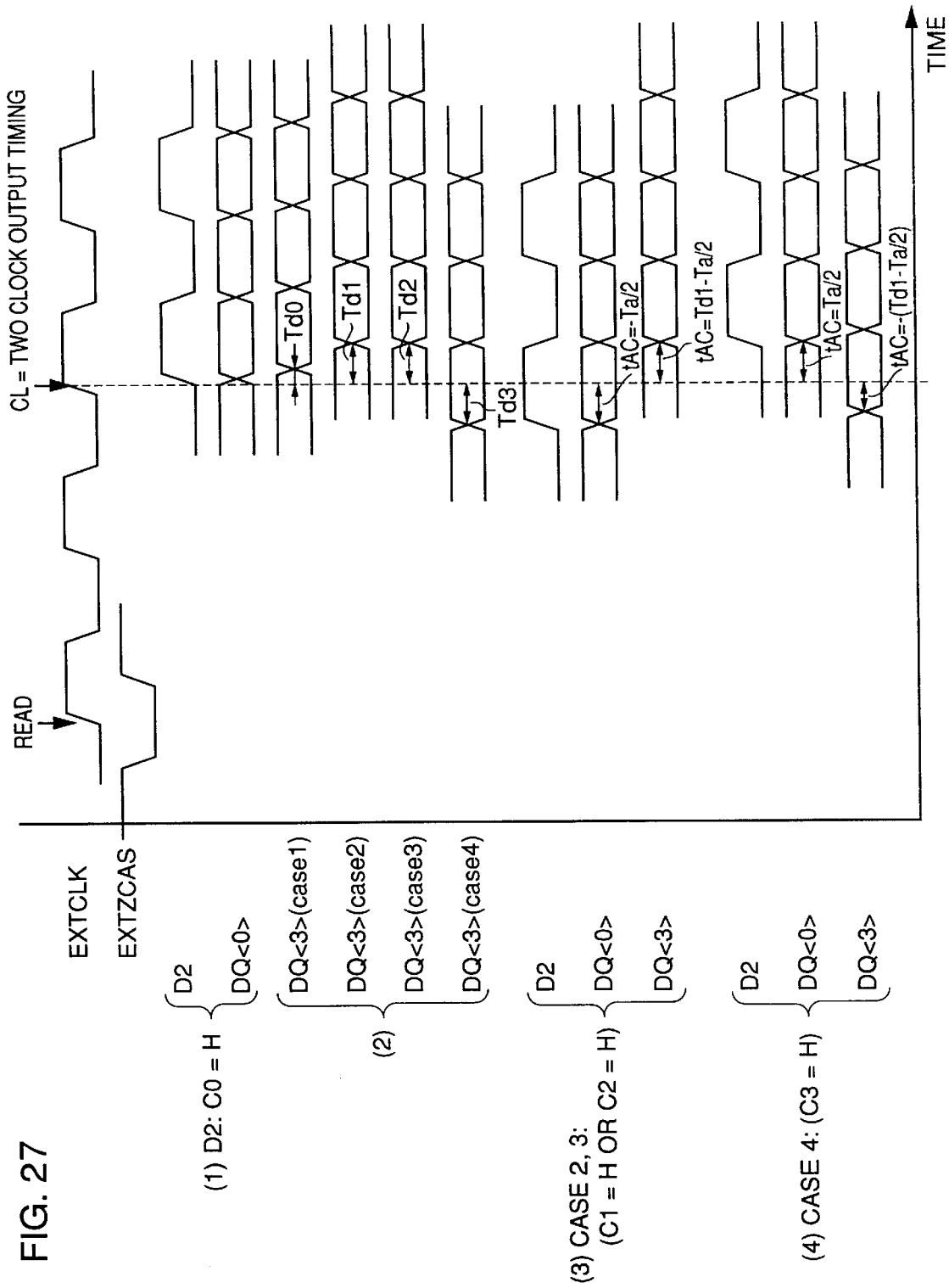
FIG. 27 illustrates an operation of a semiconductor integrated circuit according to a third embodiment.
Figure 28:
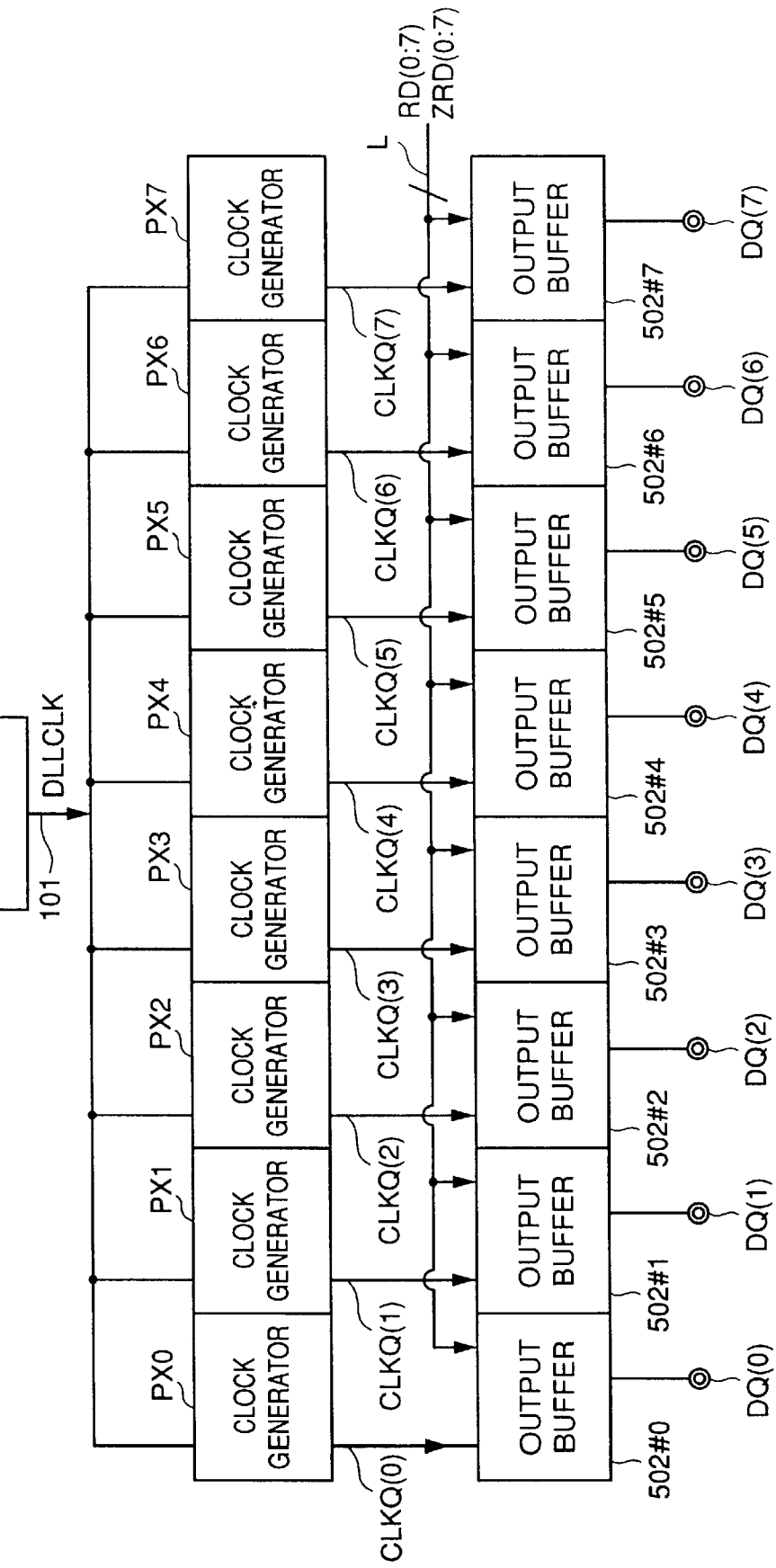
FIG. 28 is a block diagram generally showing a structure of a major part of a conventional semiconductor integrated circuit.

According to the third embodiment, signal D2 is adjusted in the following manner. Referring to (1) of FIG. 27, sizes P and Q are adjusted to allow the timing of signal D2 to conform to the latest point (DQ (0)) when code signal C0 is at H level. At this time, the data output timing of data DQ (0) satisfies the relation tAC=0.

The output timing of data DQ (3) in case 1—case 4 is as shown in (2). In case 1, the difference between the rise time of the clock and the output timing is Td0. In case 2, the difference between the rise time of the clock and the output timing is Td1. In case 3, the difference between the rise time of the clock and the output timing is Td2. In case 4, the difference between the rise time of the clock and the output timing is Td3.

As shown in (3), in case 2 and case 3 (when code signal C1 or C2 is at H level), the phase of signal D2 precedes by Ta/2. Regarding data DQ (0), the relation tAC=−Ta/2 is satisfied. Regarding data DQ (3), the relation tAC=Td1−Ta/2 is satisfied.

As shown in (4), in case 4 (when code signal C3 is at H level), the phase of signal D2 is delayed by Ta/2. Regarding data DQ (0), the relation tAC=Ta/2 is satisfied. Regarding data DQ (3), the relation tAC=−(Td3−Ta/2) is satisfied.

Accordingly, tAC can be adjusted such that a center in data output timing between data output pins is conformed to an edge of external dock signal EXTCLK.

In the semiconductor integrated circuit 3000 according to the third embodiment, the signal (output of the output replica) in the DLL circuit can be adjusted to prevent nonuniform data output timing. The margin of the data output timing can thus be improved.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor integrated circuit comprising:
   a memory cell array including a plurality of memory cells;
   a plurality of data output pins;
   a plurality of output buffers provided correspondingly to said plurality of data output pins respectively to output data read from said memory cell array to corresponding data output pins respectively;
   an internal clock generator generating an internal clock signal according to an external clock signal;
   a plurality of clock generators provided correspondingly to said plurality of output buffers respectively, each clock generator generating an output clock signal determining output timing of a corresponding output buffer based on said internal clock signal; and
   a correction circuit for correcting a skew in data output timing between said plurality of data output pins.

2. The semiconductor integrated circuit according to claim 1, wherein
   said correction circuit includes a detection circuit detecting the skew in data output timing between said plurality of data output pins, and
   said plurality of clock generators include a variable clock generator changing a phase of said output clock signal according to an output of said detection circuit.

3. The semiconductor integrated circuit according to claim 2, wherein
   said detection circuit detects a phase difference between said output clock signal supplied from a clock generator where said internal clock signal arrives latest and said output clock signal supplied from a clock generator where said internal clock signal arrives earliest.

4. The semiconductor integrated circuit according to claim 2, wherein
   said variable clock generator includes a plurality of generators respectively generating output clock signals having respective phases different from each other based on said internal clock signal, and
   one of said plurality of generators is selectively operated according to the output of said detection circuit.

5. The semiconductor integrated circuit according to claim 1, wherein
   said plurality of clock generators include a variable clock generator having a plurality of generators respectively generating output clock signals having respective phases different from each other based on said internal clock signal, and
   said correction circuit selectively operates one of said plurality of generators to allow output timing of said plurality of clock generators to conform to output timing of a clock generator where said internal clock signal arrives latest.

6. The semiconductor integrated circuit according to claim 1, wherein
said plurality of clock generators include a variable clock generator having a plurality of generators respectively generating output clock signals having respective phases different from each other based on said internal clock signal, and
said correction circuit selectively operates one of said plurality of generators to allow output timing of said plurality of clock generators to conform to output timing of a clock generator where said internal clock signal arrives earliest.

7. The semiconductor integrated circuit according to claim 2, wherein
said plurality of dock generators include:
a clock generator where said internal clock signal arrives latest; and
a variable clock generator having a plurality of generators respectively generating output clock signals having respective phases different from each other based on said internal clock signal, and
said detection circuit includes:
a first circuit imitating an output of the clock generator where said internal clock signal arrives latest;
a second circuit imitating respective outputs of said plurality of generators;
a phase comparator comparing phase of an output of said first circuit with phase of an output of said second circuit; and
a circuit for selecting one of respective outputs of said plurality of generators that is closest to the output of the clock generator where said internal clock signal arrives latest based on result of the comparison of phase.

8. The semiconductor integrated circuit according to claim 2, wherein
said plurality of clock generators include:
a clock generator where said internal clock signal arrives earliest; and
a variable clock generator having a plurality of generators respectively generating output clock signals having respective phases different from each other based on said internal clock signal, and said detection circuit includes:
a first circuit imitating an output of the clock generator where said internal clock signal arrives earliest;
a second circuit imitating respective outputs of said plurality of generators;
a phase comparator comparing phase of an output of said first circuit with phase of an output of said second circuit; and
a circuit for selecting one of respective outputs of said plurality of generators that is closest to the output of the clock generator where said internal clock signal arrives earliest based on result of the comparison of phase.

9. The semiconductor integrated circuit according to claim 2, wherein
said internal clock generator includes:
a delay circuit delaying an external clock signal to output said internal clock signal;
an output circuit receiving and outputting said internal clock signal; and
a circuit controlling delay time of said delay circuit according to a phase difference between an output of said output circuit and said internal clock signal, and
said correction circuit further includes an adjustment circuit adjusting phase of the output of said output circuit according to an output of said detection circuit.

10. The semiconductor integrated circuit according to claim 9, wherein
said correction circuit operates such that a center in data output timing between said plurality of data output pins is conformed to an edge of said external clock signal.

11. A semiconductor integrated circuit comprising:
a memory cell array including a plurality of memory cells;
a plurality of data output pins;
a plurality of output buffers provided correspondingly to said plurality of data output pins to output data read from said memory cell array to corresponding data output pins respectively;
an internal clock generator generating an internal clock signal according to an external clock signal;
a plurality of clock generators provided correspondingly to said plurality of output buffers respectively, each clock generator generating an output clock signal determining output timing of a corresponding output buffer based on said internal clock signal; and
a correction circuit for correcting data output timing of said plurality of data output pins,
said internal clock generator including:
a delay circuit delaying an external clock signal to output said internal clock signal;
an output circuit receiving and outputting said internal clock signal; and
a circuit controlling delay time of said delay circuit according to a phase difference between an output of said output circuit and said internal clock signal, and
said correction circuit including:
a detection circuit detecting a skew in data output timing between said plurality of data output pins, and
an adjustment circuit adjusting phase of the output of said output circuit according to an output of said detection circuit.

12. The semiconductor integrated circuit according to claim 11, wherein
said detection circuit detects a phase difference between said output clock signal supplied from a clock generator where said internal clock signal arrives latest and said output clock signal supplied from a clock generator where said internal clock signal arrives earliest.

13. The semiconductor integrated circuit according to claim 12, wherein
said correction circuit operates such that a center in data output timing between said plurality of data output pins is conformed to an edge of said external clock signal.

14. A semiconductor integrated circuit comprising:
a memory cell array including a plurality of memory cells;
a plurality of data output pins;
a plurality of output buffers provided correspondingly to said plurality of data output pins respectively to output data read from said memory cell array to corresponding data output pins;
an internal clock generator generating an internal clock signal according to an external clock signal;
a plurality of clock generators provided correspondingly to said plurality of output buffers, each clock generator generating an output clock signal determining output timing of a corresponding output buffer based on said internal clock signal; and a correction circuit for correcting a skew in data output timing between two of said data output pins.

15. The semiconductor integrated circuit according to claim 14, wherein said correction circuit includes a detection circuit detecting the skew in data output timing between two of said data output pins, and said plurality of clock generators include a variable clock generator changing a phase of said output clock signal according to an output of said detection circuit.

16. The semiconductor integrated circuit according to claim 15, wherein said detection circuit detects a phase difference between said output clock signals supplied from two of said data output pins.

* * * * *